United States Patent
Miura et al.

(10) Patent No.: US 9,956,594 B2
(45) Date of Patent: May 1, 2018

(54) SUBSTRATE PROCESSING METHOD

(71) Applicant: SCREEN Holdings Co., Ltd., Kyoto (JP)

(72) Inventors: Atsuyasu Miura, Kyoto (JP); Naoki Sawazaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 14/978,693

(22) Filed: Dec. 22, 2015

(65) Prior Publication Data

US 2016/0184870 A1    Jun. 30, 2016

(30) Foreign Application Priority Data

Dec. 26, 2014    (JP) .................. 2014-265537

(51) Int. Cl.
| | |
|---|---|
| *B08B 3/02* | (2006.01) |
| *B08B 3/10* | (2006.01) |
| *B08B 3/08* | (2006.01) |
| *H01L 21/02* | (2006.01) |
| *H01L 21/67* | (2006.01) |

(52) U.S. Cl.
CPC ............... *B08B 3/02* (2013.01); *B08B 3/08* (2013.01); *B08B 3/10* (2013.01); *H01L 21/02065* (2013.01); *H01L 21/67028* (2013.01); *H01L 21/67051* (2013.01)

(58) Field of Classification Search
CPC .... B08B 3/02; B08B 3/10; B08B 3/08; H01L 21/67028; H01L 21/02065; H01L 21/67051; H01L 21/02068
USPC ................................................. 134/26, 33, 34
See application file for complete search history.

(56) References Cited

U.S. PATENT DOCUMENTS

| | | | |
|---|---|---|---|
| 2003/0178047 A1 | 9/2003 | Hirae | 134/26 |
| 2005/0156285 A1 | 7/2005 | Gates et al. | 257/632 |
| 2013/0255728 A1 | 10/2013 | Noh | 134/26 |

FOREIGN PATENT DOCUMENTS

| | | |
|---|---|---|
| CN | 103357607 A | 10/2013 |
| JP | 2008-108830 A | 5/2008 |
| JP | 2009-277981 A | 11/2009 |
| TW | I324381 | 5/2010 |

*Primary Examiner* — Eric W Golightly
(74) *Attorney, Agent, or Firm* — Ostrolenk Faber LLP

(57) ABSTRACT

A substrate processing method includes a substrate holding step of holding a substrate horizontally, a liquid droplet discharging step wherein liquid droplets of an organic solvent, formed by mixing the organic solvent and a gas, are discharged from a double-fluid nozzle toward a predetermined discharge region within an upper surface of the substrate, and a liquid film forming step, executed before the liquid droplet discharging step, of supplying the organic solvent to the double fluid nozzle without supplying the gas, so as to discharge the organic solvent in a continuous stream mode from the double-fluid nozzle to form a liquid film of the organic solvent covering the discharge region on the upper surface of the substrate.

11 Claims, 12 Drawing Sheets

W

| Rotation speed (rpm) | Occurrence of particle mode | Removal performance of cleaning processing |
|---|---|---|
| 300 | Good (0~13) | Insufficient |
| 400 | Good (0~14) | Good |
| 500 | Insufficient (7~34) | Good |
| 600 | Insufficient | Good |

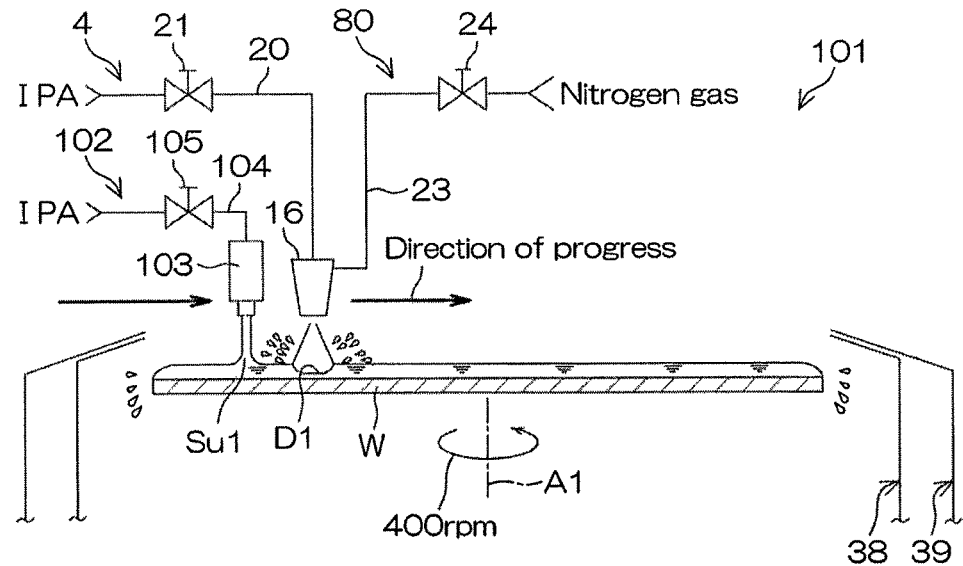
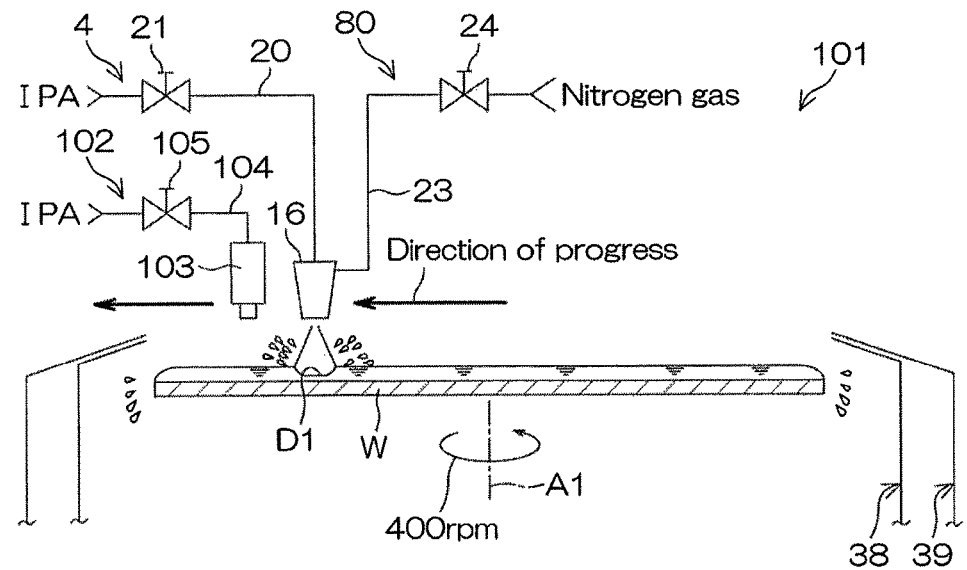

SUBSTRATE PROCESSING METHOD

BACKGROUND OF THE INVENTION

1. Field of the Invention

The present invention relates to a substrate processing method for processing a substrate by using an organic solvent. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display, a cleaning processing of supplying a cleaning liquid to a major surface of substrate, such as a semiconductor wafer or a glass substrate for liquid crystal display panel, etc., to clean the major surface of the substrate with the cleaning liquid is performed. For example, a substrate processing apparatus of a single substrate processing type that processes a substrate at a time includes a spin chuck that rotates the substrate while holding the substrate substantially horizontally by means of a plurality of chuck pins and a nozzle arranged to supply a cleaning liquid to a major surface of the substrate rotated by the spin chuck.

In the arrangement of US Patent Application No. 2003/178047 A1, a spouting nozzle that spouts minute liquid droplets of the cleaning liquid is used as the nozzle instead of a straight nozzle that discharges a continuous stream. Also, isopropyl alcohol (IPA) is used as the cleaning liquid. That is, with the arrangement of US Patent Application No. 2003/178047 A1, minute liquid droplets of IPA that are spouted from the spouting nozzle are supplied to the major surface of the substrate and the major surface is cleaned thereby.

SUMMARY OF THE INVENTION

However, at the start of discharge of the organic solvent (IPA) liquid droplets, a particle diameter distribution of the organic solvent liquid droplets discharged from a double-fluid nozzle (spouting nozzle) is in an unstable state. Therefore, when the discharge of the organic solvent liquid droplets from the double-fluid nozzle onto an upper surface (major surface) of the substrate is started, the organic solvent liquid droplets in the state of unstable particle diameter distribution collide directly against the upper surface of the substrate that is in a dry state and this may cause particles to form on the upper surface of the substrate.

An object of the present invention is thus to provide a substrate processing method by which a substrate can be processed satisfactorily using liquid droplets of an organic solvent from a double-fluid nozzle while suppressing formation of particles.

The present invention provides a substrate processing method including a substrate holding step of holding a substrate horizontally, a liquid droplet discharging step of making liquid droplets of an organic solvent, formed by mixing the organic solvent and a gas, be discharged from a double-fluid nozzle toward a predetermined discharge region within an upper surface of the substrate, and a liquid film forming step, executed before the liquid droplet discharging step, of supplying the organic solvent to the double fluid nozzle without supplying the gas to discharge the organic solvent in a continuous stream mode from the double-fluid nozzle to form a liquid film of the organic solvent covering the discharge region.

With the present method, the organic solvent liquid droplets are discharged from the double-fluid nozzle toward the discharge region within the upper surface of the substrate. Foreign matter (particles, etc.) attached to the discharge region are removed physically by collision of the organic solvent liquid droplets against the upper surface of the substrate. The upper surface of the substrate can thereby be processed satisfactorily.

Also, the organic solvent liquid film that covers the discharge region is formed op the upper surface of the substrate before the discharge of the organic solvent liquid droplets. Therefore, the organic solvent liquid droplets discharged from the double-fluid nozzle collide against the organic solvent liquid film covering the discharge region. The organic solvent liquid droplets can thus be prevented from directly colliding against the upper surface of the substrate in a dry state at the start of liquid droplet discharge at which a particle diameter distribution of the discharged organic solvent liquid droplets is unstable. Formation of particles in accompaniment with the execution of the liquid droplet discharging step can thus be suppressed.

Also, the organic solvent discharged from the double-fluid nozzle can be switched from the continuous stream mode to a liquid droplet mode by switching the supplying of the gas to the double-fluid nozzle from a stopped state to a supplying state. The organic solvent used in the liquid droplet discharging step and the organic solvent used in the liquid film forming step are discharged from a nozzle in common and therefore the liquid droplet discharging step can be started without delay after stopping the supplying of the organic solvent in the liquid film forming step. That is, the organic solvent can be supplied without interruption to the upper surface of the substrate. Drying of the upper surface of the substrate during transition from the liquid film forming step to the liquid droplet discharging step can thus be suppressed and formation of particles can thus be suppressed effectively during the transition from the liquid film forming step to the liquid droplet discharging step.

By the above, the substrate can be processed satisfactorily using the organic solvent liquid droplets from a double-fluid nozzle while suppressing the formation of particles.

Also, the substrate processing method may further include a first rotating step of rotating the substrate around the rotational axis in parallel to the liquid droplet discharging step.

With the present method, the organic solvent liquid film is formed on the upper surface of the substrate in the liquid droplet discharging step. The substrate is rotated in parallel to the liquid droplet discharging step and therefore the liquid film formed on the upper surface of the substrate can be made thin. The organic solvent liquid droplets can thus be made to arrive on the upper surface of the substrate and foreign matter attached to the upper surface of the substrate can thus be removed satisfactorily.

Also, the substrate processing method may further include a post-supplying step of supplying the organic solvent to the upper surface of the substrate after the liquid droplet discharging step.

With the present method, the organic solvent is supplied to the upper surface of the substrate in the post-supplying step performed after the liquid droplet discharging step. The foreign matter removed from the substrate upper surface by the physical cleaning in the liquid droplet discharging step can thus be rinsed off by the organic solvent and reattachment of the foreign matter onto the upper surface of the substrate can thereby be suppressed or prevented.

Also, the substrate processing method may further include a second rotating step, executed in parallel to the post-supplying step, of rotating the substrate around the rotational axis at a higher speed than that in the first rotating step.

With the present method, the rotation speed of the substrate in the post-supplying step is higher than that in the first rotating step and therefore a large centrifugal force acts on the organic solvent supplied to the upper surface of the substrate. The foreign matter removed from the substrate upper surface by the physical cleaning can thereby be spun off from sides of the substrate together with the organic solvent and remaining of the foreign matter on the upper surface of the substrate can thus be suppressed or prevented.

Also, with the substrate processing method, in the post-supplying step, the organic solvent may be supplied to the double-fluid nozzle without supplying the gas to discharge the organic solvent in a continuous stream mode from the double-fluid nozzle.

With the present method, the organic solvent discharged from the double-fluid nozzle can be switched from the liquid droplet mode to the continuous stream mode by switching the supplying of the gas to the double-fluid nozzle from the supplying state to the stopped state. The organic solvent used in the liquid droplet discharging step and the organic solvent used in the post-supplying step are discharged from a nozzle in common and therefore the post-supplying step can be started without delay after stopping the supplying of the organic solvent in the liquid droplet discharging step. That is, the organic solvent can be supplied without interruption to the upper surface of the substrate. Drying of the upper surface of the substrate during transition from the liquid droplet discharging step to the post-supplying step can thus be suppressed and formation of particles can thus be suppressed effectively during the transition from the liquid droplet discharging step to the post-supplying step.

The substrate treatment method may further include a nozzle moving step of moving the double fluid nozzle, and the liquid droplet discharging step may start discharging of droplets of the organic solvent to a landed position of the organic solvent on the upper surface of the substrate at the end of the liquid film forming step, as the discharge region.

In this case, the discharge region can be reliably covered with the organic solvent liquid film at the start of discharge of droplets of the organic solvent. Therefore, direct collision of droplets of the organic solvent against the upper surface of the substrate in the dry state can be reliably avoided at the start of discharge of droplets of the organic solvent, even in case of forming the liquid film while moving the double-fluid nozzle.

The landed position may include a peripheral edge on the upper surface of the substrate, and the liquid droplet discharging step starts discharging of droplets of the organic solvent to the peripheral edge on the upper surface of the substrate, as the discharge region.

Also, the liquid droplet discharging step may be a step that is executed in a state where a first guard is made to face a peripheral end surface of the substrate, and the substrate processing method may further include a drying step of rotating the substrate around the rotational axis, without supplying the organic solvent to the upper surface of the substrate, to dry the upper surface of the substrate and a facing guard changing step of changing the guard facing the peripheral end surface of the substrate from the first guard to a second guard, differing from the first guard, after the liquid droplet discharging step is ended and before the drying step is executed.

With the present method, in the liquid droplet discharging step in which the upper surface of the substrate is physically cleaned by the organic solvent liquid droplets, the organic solvent expelled from the substrate may contain foreign matter removed from the substrate. During the liquid droplet discharging step, the first guard faces the peripheral end surface of the substrate and the organic solvent that contains foreign matter may thus be attached to the first guard.

However, during the drying step, the second guard is made to face the peripheral end surface of the substrate instead of the first guard that may have the foreign-matter-containing organic solvent attached thereto. Therefore during the drying step, the substrate after the cleaning processing can be suppressed effectively from being contaminated by the organic solvent (foreign-matter-containing organic solvent) attached to the guard facing the peripheral end surface of the substrate.

Also, the substrate processing method may further include a discharge region moving step of moving the position of the discharge region within the upper surface of the substrate and an additional organic solvent supplying step of supplying, in parallel to the discharge region moving step, the organic solvent to a rearward position with respect to a direction of progress of the discharge region. In this case, the organic solvent does not have to be supplied to a forward position with respect to the direction of progress of the discharge region in the additional organic solvent supplying step.

With the present method, regardless of where in the upper surface of the substrate the position of the discharge region is disposed, the organic solvent is supplied separately to a vicinity of the position of the discharge region. Although if the upper surface of the substrate dries during the liquid droplet discharging step, particles may form in the dried region, with the present method, the organic solvent is supplied to the vicinity of the position of the discharge region and therefore drying of the upper surface of the substrate during the liquid droplet discharging step can be prevented.

If, for instance, the organic solvent is supplied to a forward position with respect to the direction of progress of the discharge region of the organic solvent liquid droplets from the double-fluid nozzle, the organic solvent liquid film at the discharge region becomes thick. If the liquid film that covers the discharge region is thick, the organic solvent may splash in accompaniment with the discharge of the organic solvent liquid droplets onto the discharge region. Contaminants contained in the organic solvent may scatter to the periphery due to the splashing of the organic solvent and may cause particle formation.

With the present method, the organic solvent is supplied only to the rearward position with respect to the direction of progress of the discharge region and therefore the organic solvent liquid film at the discharge region can be kept thin while preventing the drying of the upper surface of the substrate. Splashing of the organic solvent discharged onto the discharge region can thus be suppressed. Formation of particles in accompaniment with the execution of the liquid droplet discharging step can thereby be suppressed more effectively.

Also, the substrate processing method may further include a first preliminary preparation step of preparing a silicon substrate, having $SiO_2$ disposed at the upper surface, as the substrate.

With the present method, the organic solvent is low in etching power with respect to $SiO_2$. Therefore, a surface of the silicon substrate can be cleaned satisfactorily without excessively etching the $SiO_2$ disposed at the upper surface of the substrate.

Also, the substrate processing method may further include a second preliminary preparation step of preparing a semiconductor substrate, including an insulating film constituted of a low dielectric constant material of lower relative dielectric constant than $SiO_2$ and a copper wiring disposed on the insulating film, as the substrate.

With the present method, the organic solvent is used as the cleaning liquid to clean the upper surface of the substrate. The organic solvent is low in oxidizing power with respect to copper. The upper surface of the semiconductor substrate can thus be cleaned satisfactorily without excessively etching the copper wiring.

In this case, the organic solvent may have a low surface tension. A low dielectric constant material has a high contact angle and therefore a surface of the insulating film exhibits high hydrophobicity (lyophobicity). However, the surface of the insulating film having high hydrophobicity can be wetted satisfactorily by using an organic solvent, having a low surface tension, as the cleaning liquid. A liquid film of the organic solvent that covers an entirety of the upper surface of the semiconductor substrate can thereby be formed satisfactorily.

The above and yet other objects, features, and effects of the present invention shall be made clear by the following description of the preferred embodiments in reference to the attached drawings.

BRIEF DESCRIPTION OF THE DRAWINGS

FIGS. 12A and 12B are illustrative diagrams for describing a processing example of a cleaning processing according to the second preferred embodiment of the present invention.

DETAILED DESCRIPTION OF PREFERRED EMBODIMENTS

Figure 1:
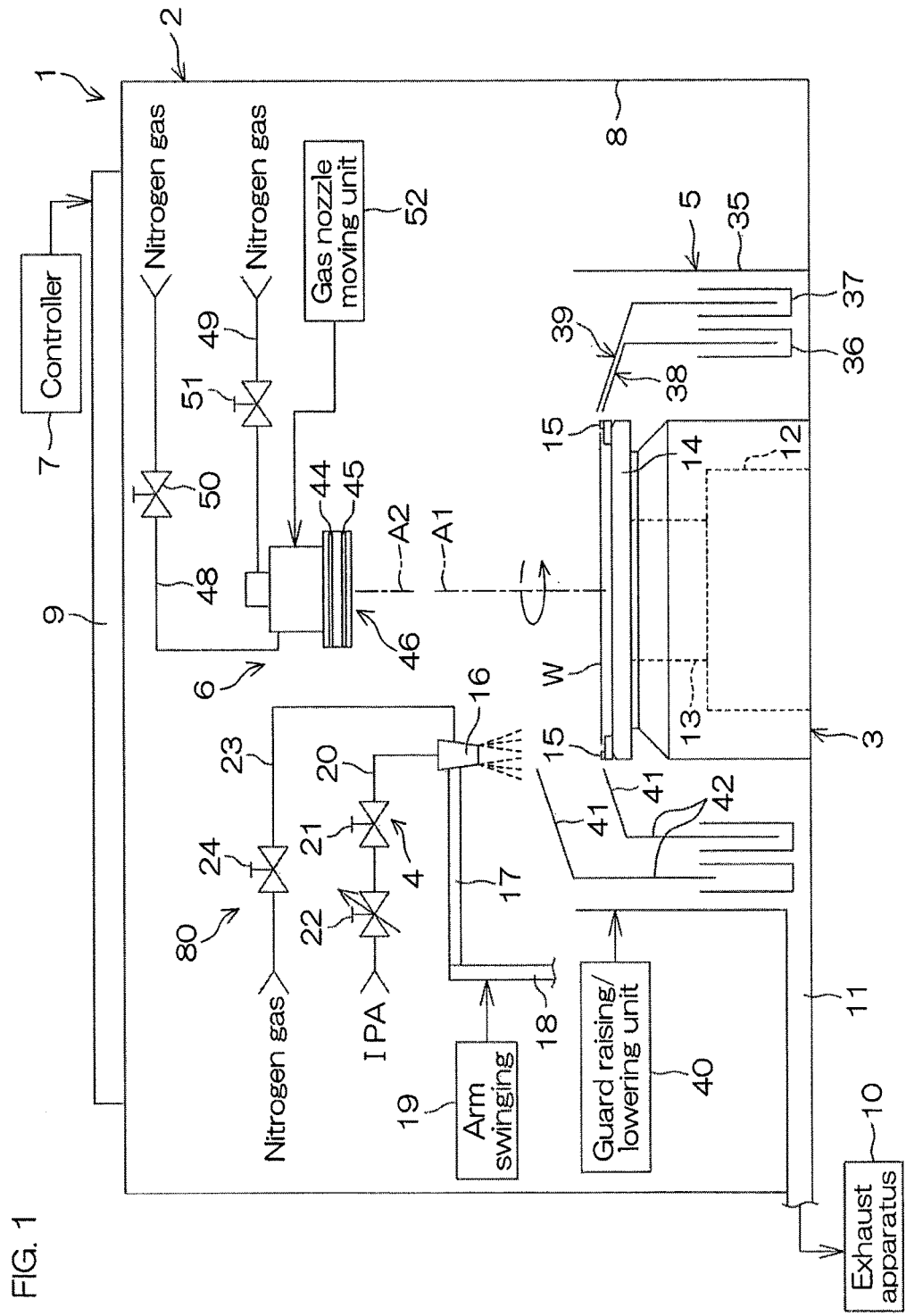
FIG. 1 is a diagram of a substrate processing apparatus which executes a substrate processing method according to a first preferred embodiment of the present invention as viewed from a horizontal direction.
Figure 2A:
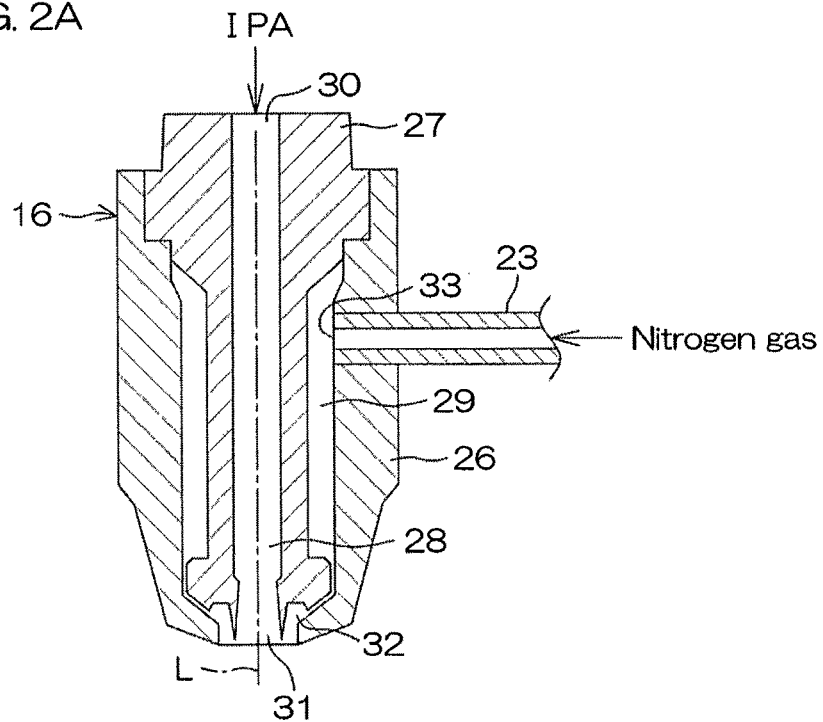
FIG. 2A is an illustrative sectional view of the arrangement of a double-fluid nozzle included in the substrate processing apparatus.

FIG. 1 is a diagram of a substrate processing apparatus 1 which executes a substrate processing method according to a first preferred embodiment of the present invention as viewed from a horizontal direction. FIG. 2A is an illustrative sectional view of the arrangement of a double-fluid nozzle 16 included in the substrate processing apparatus 1.

Figure 3:
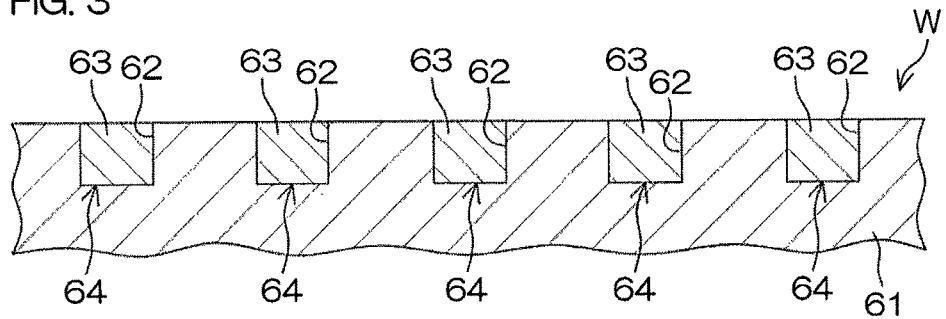
FIG. 3 is an enlarged sectional view of a vicinity of a front surface of a substrate to be processed by the substrate processing apparatus.

The substrate processing apparatus 1 is a single substrate processing type apparatus arranged to perform a cleaning processing on a major surface (upper surface) at a device formation region side of a substrate W, such as a silicon substrate 61 (see FIG. 3). The substrate processing apparatus 1 includes a box-shaped processing chamber 2 having an internal space, a spin chuck (substrate holding unit) 3 holding a single substrate W in a horizontal attitude inside the processing chamber 2 and rotating the substrate W around a vertical rotational axis A1 passing through the center of the substrate W, a double-fluid nozzle 16 arranged to discharge liquid droplets of IPA that is an example of an organic solvent onto an upper surface of the substrate W held by the spin chuck 3, an organic solvent supplying unit (first organic solvent supplying unit) 4 arranged to supply IPA to the double-fluid nozzle 16, a gas supplying unit (gas supplying unit) 80 arranged to supply nitrogen gas as an example of a gas to the double-fluid nozzle 16, a cylindrical processing cup 5 surrounding the spin chuck 3, and a controller (control unit) 7 controlling operations of apparatuses and opening/closing of valves provided in the substrate processing apparatus 1.

The processing chamber 2 includes a box-shaped partition wall 8, an FFU (fan filter unit) 9 as a blower unit delivering clean air from an upper portion of the partition wall 8 into an interior of the partition wall 8 (corresponding to an interior of the processing chamber 2), and an exhaust apparatus 10 expelling gas inside the processing chamber 2 from a lower portion of the partition wall 8. The spin chuck 3 and the double-fluid nozzle 16 are housed and disposed within the partition wall 8.

The FFU 9 is disposed above the partition wall 8 and is mounted on a roof of the partition wall 8. The FFU 9 delivers the clean air into the processing chamber 6 from the roof of the partition wall 13. The exhaust apparatus 10 is connected via an exhaust duct 11, connected to an interior of the processing cup 5, to a bottom portion of the processing cup 5 and suctions the interior of the processing cup 5 from the bottom portion of the processing cup 5. A down flow (downward flow) is formed inside the processing chamber 6 by the FFU 9 and the exhaust apparatus 10.

As the spin chuck 3, a clamping type chuck, which clamps the substrate W in horizontal directions to hold the substrate W horizontally, is adopted. Specifically, the spin chuck 3 includes a spin motor (substrate rotating unit) 12, a spin shaft 13 made integral to a drive shaft of the spin motor 12, and a disk-shaped spin base 14 mounted substantially horizontally on an upper end of the spin shaft 13.

A plurality (not less than three, that is, for example, six) of clamping members 15 are disposed at a peripheral edge portion of an upper surface of the spin base 14. At the upper surface peripheral edge portion of the spin base 14, the plurality of clamping members 15 are disposed at suitable intervals on a circumference corresponding to an outer peripheral shape of the substrate W.

Also, the spin chuck 3 is not restricted to a clamping type and, for example, a vacuum suction type arrangement (vacuum chuck) that vacuum-suctions a rear surface of the substrate W to hold the substrate W in a horizontal attitude and further performs rotation around a vertical rotation axis in this state to rotate the substrate W held by the spin chuck 3 may be adopted instead.

The double-fluid nozzle 16 has a basic form of a scan nozzle capable of changing a position on a front surface of the substrate W to which IPA is supplied (discharge region D1 (see FIG. 6B)). The double-fluid nozzle 16 is mounted to a tip portion of a nozzle arm 17 extending substantially horizontally above the spin chuck 3. The nozzle arm 17 is supported by an arm supporting shaft 18 extending substantially vertically at a side of the spin chuck 3. An arm swinging unit (nozzle moving unit) 19 is coupled to the arm supporting shaft 18. The double-fluid nozzle 16 is arranged to be capable of being moved above the spin chuck 3 between the rotational axis A1 of the substrate W and a peripheral edge of the substrate W by swinging the nozzle arm 17 by turning the arm supporting shaft 18 by a driving force of the arm swinging unit 19. It is also made capable of being moved from above the spin chuck 3 toward a home position at a side of the spin chuck 3.

The organic solvent supplying unit 4 includes an organic solvent piping 20 supplying liquid IPA at ordinary temperature from an IPA supply source to the double-fluid nozzle 16, an organic solvent valve 21 switching between supplying and stopping the supply of IPA from the organic solvent piping 20 to the double-fluid nozzle 16, and a flow control valve 22 adjusting an opening degree of the organic solvent piping 20 to adjust a flow rate of IPA discharged from the double-fluid nozzle 16. As shall be described later, the IPA discharged from the double-fluid nozzle 16 is used not only in an IPA liquid droplet discharging step (S4 of FIG. 5) but also in an IPA liquid film forming step (S3 of FIG. 5) and an IPA post-supplying step (S5 of FIG. 5). That is, second and third organic solvent supplying units are realized by the organic solvent supplying unit 4 and the double-fluid nozzle 16.

A gas supplying unit 80 includes a first gas piping 23 supplying a gas from a gas supply source and a first gas valve 24 switching between supplying and stopping the supply of gas from the first gas piping 23 to the double-fluid nozzle 16. As the gas supplied to the double-fluid nozzle 16, an inert gas, dry air, or clean air, etc., may be used besides nitrogen gas.

As shown in FIG. 2A, the double-fluid nozzle 16 has a substantially circular columnar outer shape. The double-fluid nozzle 16 includes an outer cylinder 26 constituting a casing and an inner cylinder 27 fitted in an interior of the outer cylinder 26.

The outer cylinder 26 and the inner cylinder 27 are respectively disposed coaxially on a central axis L in common and are joined to each other. An internal space of the inner cylinder 27 is a rectilinear organic solvent flow passage 28 through which the IPA from the organic solvent piping 20 flows. Also, a circular cylindrical first gas flow passage 29, through which the gas supplied from the first gas piping 23 flows, is formed between the outer cylinder 26 and the inner cylinder 27.

The organic solvent flow passage 28 opens as an organic solvent inlet 30 at an upper end of the inner cylinder 27. The IPA from the organic solvent piping 20 is introduced via the organic solvent inlet 30 into the organic solvent flow passage 28. Also, the organic solvent flow passage 28 opens as a circular organic solvent discharge port 31 having a center on the central axis L at a lower end of the inner cylinder 27. The IPA introduced into the organic solvent flow passage 28 is discharged from the organic solvent discharge port 31.

On the other hand, the first gas flow passage 29 is a circular cylindrical gap having a central axis in common with the central axis L, is closed at upper end portions of the outer cylinder 26 and the inner cylinder 27, and opens as a circular annular gas discharge port 32, having a center on the central axis L and surrounding the organic solvent discharge port 31, at lower ends of the outer cylinder 26 and the inner cylinder 27. A lower end portion of the first gas flow passage 29 is made smaller in flow passage area than an intermediate portion in a length direction of the first gas flow passage 29 and decreases in diameter toward a lower side. Also, a gas inlet 33 in communication with the first gas flow passage 29 is defined at an intermediate portion of the outer cylinder 26.

The first gas piping 23 is connected in a state of penetrating through the outer cylinder 26 to the gas inlet 33 and an internal space of the first gas piping 23 is in communication with the first gas flow passage 29. The gas from the first gas piping 23 is introduced via the gas inlet 33 into the first gas flow passage 29 and is discharged from the gas discharge port 32.

By opening the organic solvent valve 21 to make the IPA be discharged from the organic solvent discharge port 31 while opening the first gas valve 24 to make the gas be discharged from the gas discharge port 32, the gas can be made to collide (mix) with the IPA at a vicinity of the double-fluid nozzle 16 to thereby form minute liquid droplets of the IPA and discharge the IPA in the form of a mist.

On the other hand, by opening the organic solvent valve 21 to make the IPA be discharged from the organic solvent discharge port 31 with the first gas valve 24 being closed, the IPA can be discharged from the double-fluid nozzle 16 in a continuous stream mode. Hereinafter, the IPA (organic solvent) in the continuous stream mode shall be referred to as the "continuous stream of IPA (organic solvent)."

As shown in FIG. 1, the processing cup 5 includes a cylindrical wall 35 surrounding the spin chuck 3 and having, for example, a circular cylindrical shape, a plurality of cups 36 and 37 (first and second cups 36 and 37) disposed fixedly between the spin chuck 3 and the cylindrical wall 35, a plurality of guards 38 and 39 (first and second guards 38 and 39) arranged to receive the IPA that is scattered to a periphery of the substrate W, and a guard raising/lowering unit (guard raising/lowering unit) 40 that raises and lowers each of the guards 38 and 39 independently. The processing cup 5 is collapsible.

The cylindrical wall 35 surrounds a periphery of the spin chuck 3. The cylindrical wall 35 is arranged to be capable of storing IPA in its interior. The IPA stored in the cylindrical wall 35 is guided to a drain equipment (not shown). Also, an upstream end of an exhaust duct 11 is connected to a predetermined location in a circumferential direction of a lower end portion of the cylindrical wall 35. The atmosphere inside the cylindrical wall 35 is exhausted through the exhaust duct 11 by the exhaust apparatus 10.

Each of the cups 36 and 37 defines an upwardly-open, annular groove. The IPA guided to the first cup 36 is delivered through a first piping (not shown) connected to a bottom portion of the groove to a recovery equipment (not shown) or the drain equipment (not shown). The IPA guided to the second cup 37 is delivered through a second piping (not shown) connected to a bottom portion of the groove to the recovery equipment (not shown) or the drain equipment (not shown). The IPA used in processing the substrate W is thereby subject to a recovery processing or a drain processing.

Each of the guards 38 and 39 has a circular cylindrical inclining portion 41 extending obliquely upward toward the rotational axis A1 and a circular cylindrical guide portion 42 extending downward from a bottom end of the inclining portion 41. An upper end portion of each inclining portion 41 constitutes an inner peripheral portion of the guard 38 or 39 and has a larger diameter than the substrate W and the spin base 14. The two inclining portions 41 are overlapped vertically and the two guide portions 42 are disposed coaxially. Each of the guide portions 42 of the guards 38 and 39 is capable of entering into and exiting from the corresponding cup 36 or 37. The processing cup 5 is extended or collapsed by the guard raising/lowering unit 40 raising or lowering at least one of the two guards 38 and 39. In FIG. 1, a state in which the processing cup 5 differs at the right side and the left side of the rotational axis A1 is illustrated for the sake of description.

The guard raising/lowering unit 40 raises and lowers each of the guards 38 and 39 between an upper position, at which an upper end of the guard is positioned higher than the substrate W, and a lower position, at which the upper end of the guard is positioned lower than the substrate W. The guard raising/lowering unit 40 is capable of holding each of the guards 38 and 39 at any position between the upper position and the lower position. The supplying of IPA to the substrate W and the drying of the substrate W are performed in a state where either of the guards 38 and 39 faces a peripheral end surface of the substrate W. For example, if the first guard 38 at the inner side is to be made to face the peripheral end surface of the substrate W, the guards 38 and 39 are disposed at the lower position (state shown at the right side in FIG. 1). Also, if the second guard 39 is to be made to face the peripheral end surface of the substrate W, the first guard 38 is disposed at the lower position and the second guard 39 is disposed at the upper position (state shown at the left side in FIG. 1).

As shown in FIG. 1, the substrate processing apparatus 1 further includes a gas discharge nozzle 6 arranged to perform gas discharge above the substrate W held by the spin chuck 3. The gas discharge nozzle 6 includes an annular upper gas discharge port 44 opening outward at an outer peripheral surface that is a side surface of the gas discharge nozzle 6, an annular lower gas discharge port 45 opening outward at the outer peripheral surface that is the side surface of the gas discharge nozzle 6, and a central gas discharge port 46 opening downward at a lower surface of the gas discharge nozzle 6. The upper gas discharge port 44 is disposed higher than the lower gas discharge port 45. The central gas discharge port 46 is disposed lower than the upper gas discharge port 44 and the lower gas discharge port 45 and further inward (further toward a central axis A2 of the gas discharge nozzle 6) than the upper gas discharge port 44 and the lower gas discharge port 45. The upper gas discharge port 44 and the lower gas discharge port 45 are slit-shaped discharge ports centered at the central axis A2 of the gas discharge nozzle 6 and surrounding an entire circumference of the side surface of the gas discharge nozzle 6. An outer diameter of the upper gas discharge port 44 may be equal to an outer diameter of the lower gas discharge port 45 or may be greater or less than the outer diameter of the lower gas discharge port 45.

The gas discharge nozzle 6 is a circular columnar member of smaller diameter than the substrate W. A second gas piping 48 and a third gas piping 49 are connected to the gas discharge nozzle 6. Second and third gas valves 50 and 51 are respectively interposed in the second and third gas pipings 48 and 49. The gas from the gas supply source is introduced into the gas discharge nozzle 6 via the second gas piping 48 and is supplied to the upper gas discharge port 44 and the lower gas discharge port 45 via a second gas flow passage (not shown). Also, the gas flowing inside the third gas piping 49 is introduced into the gas discharge nozzle 6 via the third gas piping 49 and is supplied to the central gas discharge port 46 via a third gas flow passage (not shown). When the second gas valve 50 is opened, the gas is discharged radially to a periphery of the gas discharge nozzle 6 from the gas discharge ports 44 and 45. When the third gas valve 51 is opened, the gas is discharged downward from the central gas discharge port 46. Although nitrogen gas is indicated as an example of the gas supplied to the gas discharge nozzle 6, an inert gas, dry air, or clean air, etc., may be used instead as the gas.

A gas nozzle moving unit 52 is coupled to the gas discharge nozzle 6. The gas nozzle moving unit 52 makes the gas discharge nozzle 6 turn around a vertical swinging axis (not shown) provided at a side of the spin chuck 3. The gas nozzle moving unit 52 also moves the gas discharge nozzle 6 in an up/down direction. When the gas nozzle moving unit 52 raises or lowers the gas discharge nozzle 6 when the gas discharge nozzle 6 is positioned above the substrate W, the gas discharge nozzle 6 is raised or lowered above the substrate W so that a distance between the substrate W and the gas discharge nozzle 6 changes. The gas nozzle moving unit 52 also makes the gas discharge nozzle 6, be positioned, for example, at any of a retracted position, an upper position (the position shown in FIG. 1), and a proximity position (position shown in FIG. 6E). The retracted position is a position at which the gas discharge nozzle 6 is retracted to a side of the spin chuck 3 and the upper position and the proximity position are positions at which the gas discharge nozzle 6 is positioned above a central portion of the substrate W. The upper position is a position above the proximity position and the proximity position is a position at which the lower surface of the gas discharge nozzle 6 is made more proximal to an upper surface central portion of the substrate W than at the upper position. The gas nozzle moving unit 52 is capable of holding the gas discharge nozzle 6 at any position between the retracted position and the upper position and any position between the upper position and the proximity position.

Figure 2B:
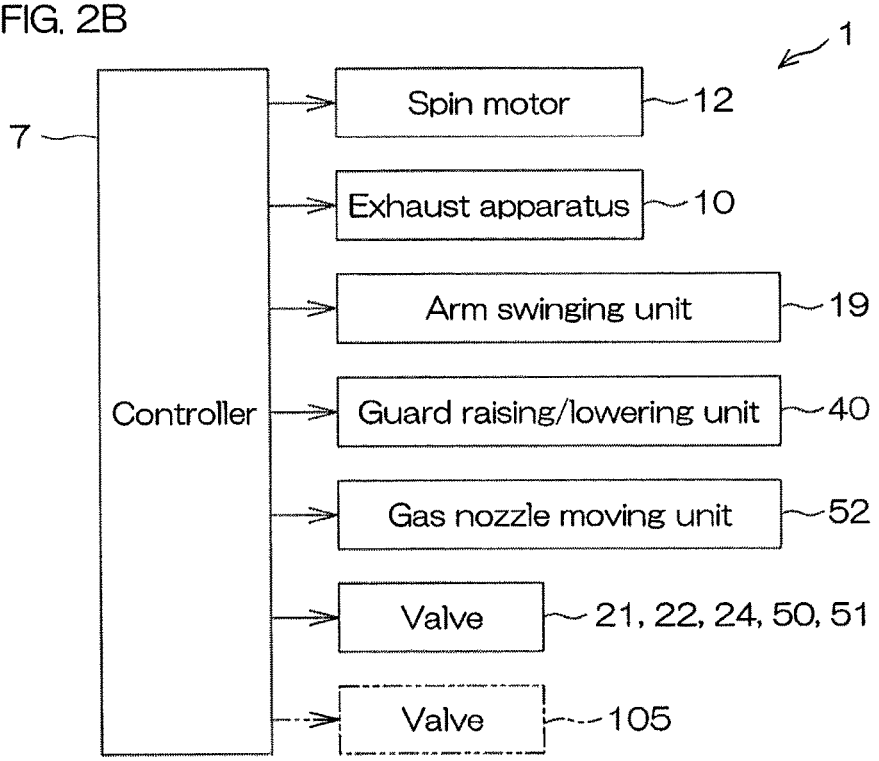
FIG. 2B is a block diagram for explaining the electrical structure of the substrate treatment apparatus shown in FIG. 1.

FIG. 2B is a block diagram for explaining the electrical structure of the substrate treatment apparatus 1. The controller 7 has an arrangement that includes a microcomputer. The controller 7 includes an operation unit including a CPU and the like, a storage unit comprising a read-only memory device, and an input-output unit. A program for the operation unit executes is stored in the storage unit.

The controller 7 is connected to the operations of the exhaust apparatus 10, the spin motor 12, the arm swinging unit 19, the guard raising/lowering unit 40, the gas nozzle moving unit 52, the organic solvent valve 21, the flow control valve 22, the first gas valve 24, and the like. The controller 7 controls the operations of the exhaust apparatus 10, the spin motor 12, the arm swinging unit 19, the guard raising/lowering unit 40, the gas nozzle moving unit 52, etc., in accordance with a predetermined program. The controller 7 controls the opening and closing operation etc. on the organic solvent valve 21, the flow control valve 22, the first gas valve 24, etc., in accordance with a predetermined program.

FIG. 3 is an enlarged sectional view of a vicinity of the front surface of the substrate W to be processed by the substrate processing apparatus 1.

The substrate W to be processed constitutes a base of a MOSFET and includes the silicon substrate 61. At a surface layer portion of the silicon substrate 61, trenches 62 are formed by digging from the front surface. A plurality of the trenches 62 are formed at fixed intervals in a right/left direction in FIG. 3 with each extending in a direction orthogonal to a paper surface of FIG. 3. $SiO_2$ 63 (silicon oxide) is embedded in each trench 62. The $SiO_2$ 63 forms element separating portions 64 that insulate element forming regions from other regions. The element separating portion 64 has an STI structure, with which the trench 62 is refilled with an insulating material ($SiO_2$ 63). A front surface of the $SiO_2$ 63 is made substantially flush with the front surface of the silicon substrate 61.

Figure 4A:
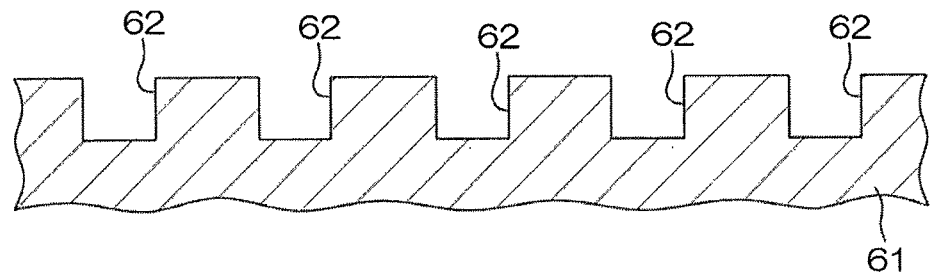
FIGS. 4A to 4C are illustrative sectional views showing a method for manufacturing the substrate shown in FIG. 3 in order of process.
Figure 4B:
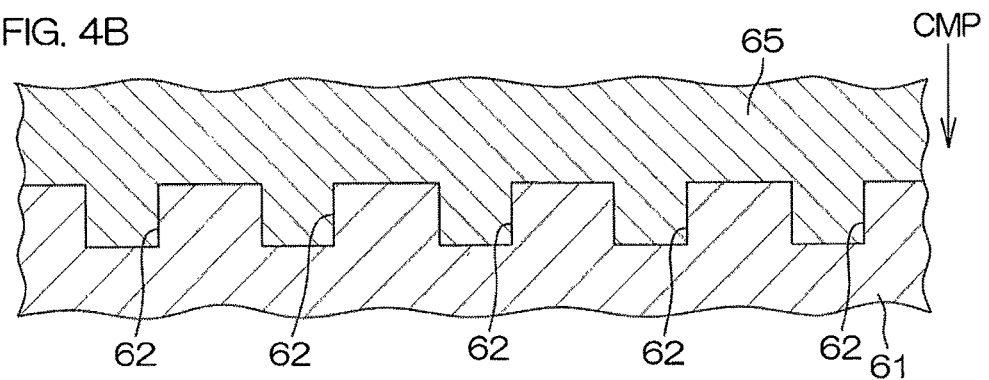
Figure 4C:
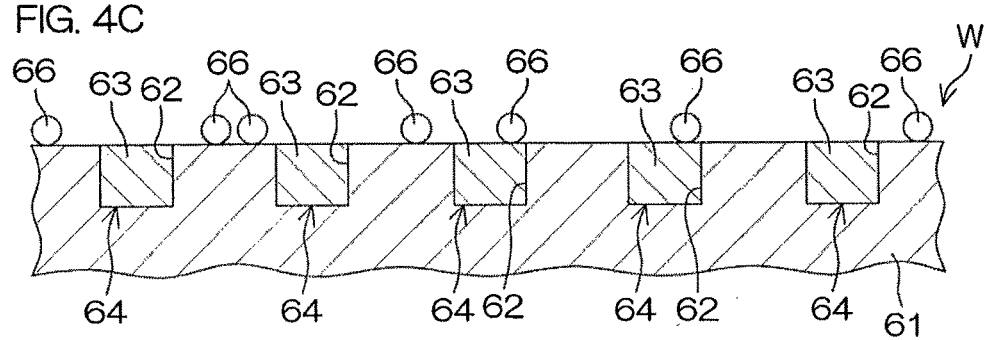

FIGS. 4A to 4C are illustrative sectional views showing a method for manufacturing the substrate W in order of process. As shown in FIG. 4A, first, the trenches 62 are formed by reactive ion etching in the surface layer portion of the silicon substrate 61. Next, an $SiO_2$ film 65 is formed by a vacuum CVD (chemical vapor deposition) method on an upper surface of the silicon substrate W and inside each trench 62 as shown in FIG. 4B. As shown in FIG. 4B, the $SiO_2$ film 65 fills the interiors of the trenches 62 completely and is also formed on the silicon substrate 61 outside the trenches 62.

Next, portions of the $SiO_2$ film, 65 protruding outside the respective trenches 62 are removed selectively by a CMP (chemical mechanical polishing) method. A front surface of the $SiO_2$ film 65 is thereby made a flat surface that is substantially flush with the front surface of the silicon substrate 61 and the element separating portions 64 are formed as shown in FIG. 4C (first preliminary preparation step).

The element separating portions 64 are formed by polishing the $SiO_2$ film 65 by the CMP method and therefore particles 66, such as $SiO_2$ polishing scraps (slurry), etc., are present on the surface layer portion of the substrate W immediately after manufacture. The substrate processing apparatus 1 applies the cleaning processing to the substrate W to remove the $SiO_2$ polishing scraps and other particles 66 from the substrate W.

In such a cleaning processing, the use of SC1 (ammonia-hydrogen peroxide mixture) as a cleaning liquid may be considered. However, when SC1 is used to clean the front surface of the substrate W, the element separating portions 64 that are constituted of $SiO_2$ may become etched excessively and the front surfaces of the element separating portions 64 may become recessed. In this case, not only are the element separating characteristics of the element separating portions 64 degraded but the MOSFET may also become poor in flatness after manufacture of the MOSFET.

On the other hand, in the cleaning processing according to the present preferred embodiment, the front surface (upper surface) of the substrate W is cleaned using IPA as the cleaning liquid. IPA has only low etching power with respect to $SiO_2$. The front surface (upper surface) of the substrate W can thus be cleaned satisfactorily without excessively etching the element separating portions 64 that are constituted of $SiO_2$.

Figure 5:
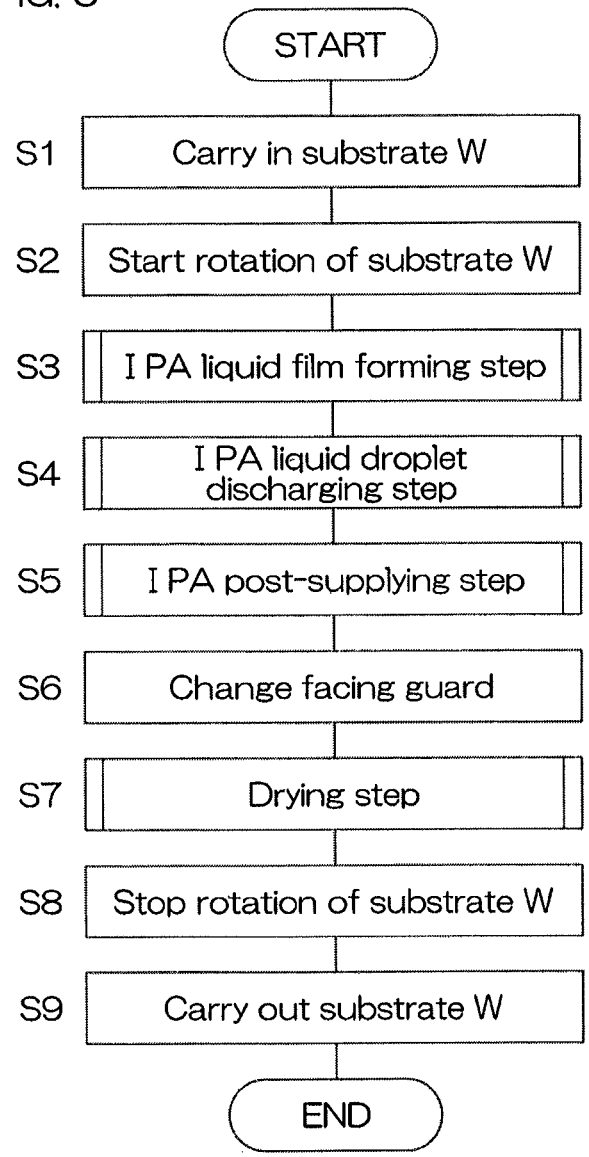
FIG. 5 is a flowchart for describing a processing example of a cleaning processing performed by the substrate processing apparatus.

FIG. 5 is a flowchart for describing a processing example of the cleaning processing performed by the substrate processing apparatus 1. FIGS. 6A to 6E are illustrative diagrams for describing the processing example of the cleaning processing.

An example of the cleaning processing shall now be described with reference to FIG. 1, FIG. 3, and FIG. 5. FIGS. 6A to 6E shall be referenced where appropriate.

When the cleaning processing is to be applied to the substrate W by the substrate processing apparatus 1, the substrate W (in the state shown in FIG. 4C) after removal of the $SiO_2$ film 65 (see FIG. 4B) by CMP is carried into the interior of the processing chamber 2 (step S1 of FIG. 5). Specifically, the controller 7 makes a hand (not shown) of a substrate transfer robot (not shown), which holds the substrate W, enter into the interior of the processing chamber 2 in a state where all nozzles are retracted from above the spin chuck 3 and the first and second guards 38 are lowered to the lower position so that the upper ends of the first and second guards 38 and 39 are all disposed lower than the position of holding of the substrate W by the spin chuck 3. The substrate W is thereby passed onto the spin chuck 3 and held by the spin chuck 3 in a state where the major surface, which is to be processed, is faced upward (substrate holding step).

Thereafter, the controller 7 controls the guard raising/lowering unit 40 to raise both the first and second guards 38 and 39 to the upper positions and make the first guard 38 face the peripheral end surface of the substrate W.

The controller 7 starts the rotation of the substrate W by the spin motor 12 (step S2 of FIG. 5). The rotation speed of the substrate W is raised to a predetermined first high rotation speed (for example of approximately 1000 rpm) and is held at that first high rotation speed.

Figure 6A:
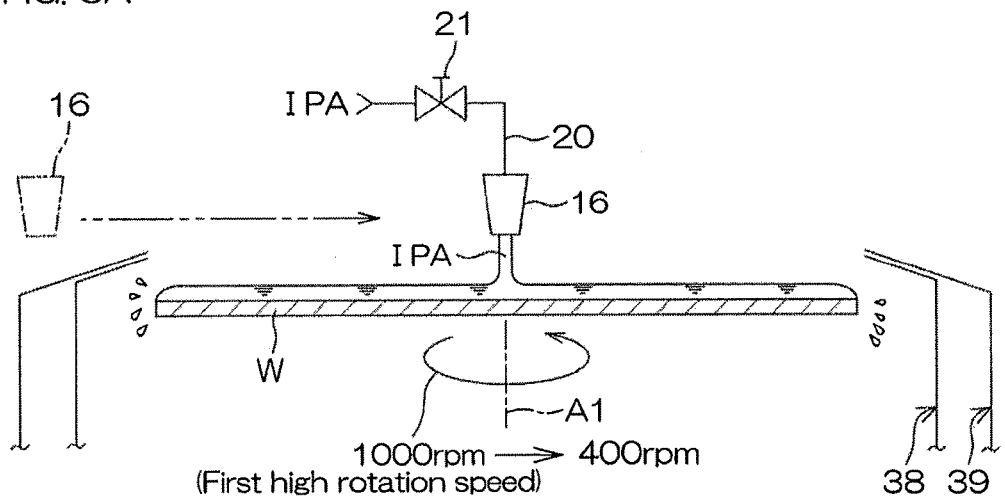
FIGS. 6A and 6B are illustrative diagrams for describing the processing example of the cleaning processing.

When rotation of the substrate W reaches the first high rotation speed, the controller 7 then performs the IPA liquid film forming step (liquid film forming step; step S3 of FIG. 5) of forming a liquid film of IPA on the upper surface of the substrate W as shown in FIG. 6A. Specifically, the controller 7 controls the arm swinging unit 19 so that the double-fluid nozzle 16 is moved from the home position retracted to the side of the spin chuck 3 to a central position (position indicated by solid lines in FIG. 6A), at which the discharged IPA lands on an upper surface central portion of the substrate W, and then kept still at the central position. After the double-fluid nozzle 16 is disposed at the central position, the controller 7 opens the organic solvent valve 21 while closing the first gas valve 24. A continuous stream of IPA is thereby discharged from the double-fluid nozzle 16. The discharge flow rate of the IPA from the double-fluid nozzle 16 is set to a low flow rate (for example of 0.1 (liters/minute)) by opening degree adjustment of the organic solvent piping 20 by the flow control valve 22. Also, a period from the start of rotation of the substrate W to the start of discharge of the IPA is, for example, approximately 2.5 seconds.

As shown in FIG. 6A, the IPA discharged from the double-fluid nozzle 16 lands on the upper surface of the substrate W rotating at the first high rotation speed and thereafter receives a centrifugal force due to the rotation of the substrate W and flows outward along the upper surface of the substrate W. The IPA is thus supplied to an entirety of the upper surface of the substrate W and an IPA liquid film covering the entirety of the upper surface of the substrate W is formed on the substrate W. The IPA that has reached a peripheral edge portion upon flowing on the upper surface of the substrate W is scattered toward sides of the substrate W from the peripheral edge portion of the substrate W.

As shown in FIG. 6A, the IPA that scatters from the peripheral edge portion of the substrate W is received by an inner wall of the first guard 38. The IPA that flows down along the inner wall of the first guard 38 is received by the first cup 36 and collected at a bottom portion of the first cup 36. The IPA collected at the bottom portion of the first cup 36 is delivered through the first piping (not shown) to the recovery equipment (not shown) or the drain equipment (not shown).

When a predetermined period elapses from the start of discharge of the IPA, the controller 7 controls the spin motor 12 to decelerate the rotation speed of the substrate W to a liquid processing speed (for example of approximately 400 rpm) and maintain the rotation speed at the liquid processing speed. Thereafter, while sustaining the discharge of IPA from the double-fluid nozzle 16 (while maintaining the discharge flow rate of IPA as it is), the controller 7 controls the arm swinging unit 19 so that the double-fluid nozzle 16 is moved toward a peripheral edge position (position indicated by solid lines in FIG. 6B), at which the IPA discharged from the double-fluid nozzle 16 lands on an upper surface peripheral edge portion of the substrate W, and disposed at the peripheral edge position. The IPA liquid film forming step (S3) is thereby ended. A processing period of the IPA liquid film forming step (S3) is, for example, approximately 5 to 6 seconds.

Also, the rotation speed of the substrate W is decelerated to the liquid processing speed prior to the end of the IPA liquid film forming step (S3) because if the rotation of the substrate W at the first high rotation speed is continued as it is, the IPA supplied to the upper surface of the substrate W may volatilize, causing the upper surface of the substrate W to dry and thereby cause particle formation.

Figure 6B:
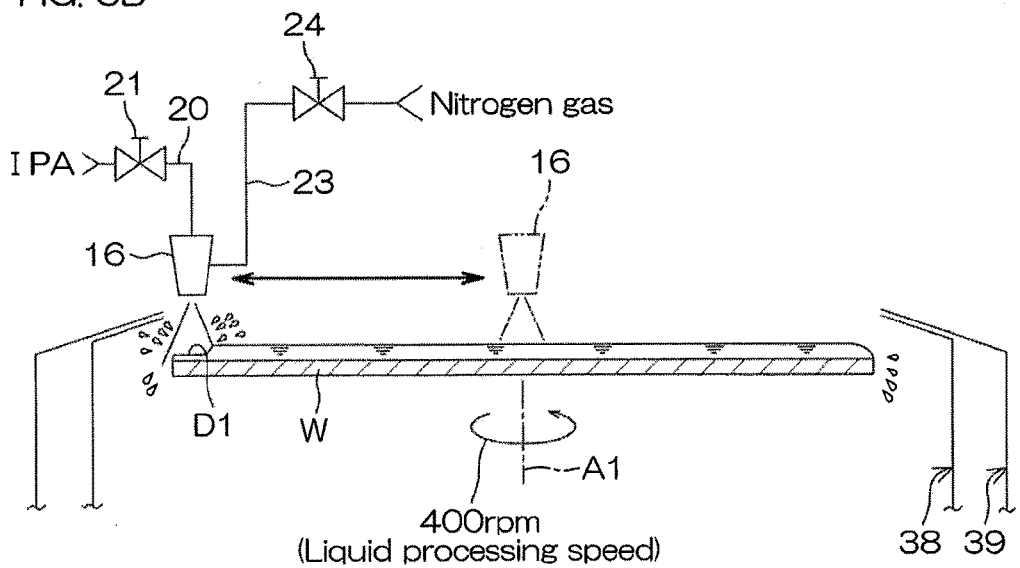

After the double-fluid nozzle 16 is disposed at the peripheral edge position, the IPA liquid droplet discharging step (liquid droplet discharging step; first rotating step; step S4 of FIG. 5) of discharging liquid droplets of the IPA onto the upper surface of the substrate W from the double-fluid nozzle 16 is performed as shown in FIG. 6B. Specifically, the controller 7 opens the first gas valve 24 while sustaining the discharge of IPA (while maintaining the discharge flow rate of IPA as it is). The IPA and the nitrogen gas, which is an example of the gas, are thereby supplied simultaneously to the double-fluid nozzle 16 and the supplied IPA and nitrogen gas are mixed at a vicinity of the discharge port (organic solvent discharge port 31 (see FIG. 2B)) at the exterior of the double-fluid nozzle 16. A jet of minute liquid droplets of the IPA is thereby formed and the jet of IPA liquid droplets is discharged from the double-fluid nozzle 16. A circular discharge region D1 is thus formed on the upper surface of the substrate W and the position of the discharge region D1 is disposed at a peripheral edge portion of the substrate W.

Numerous IPA liquid droplets from the double-fluid nozzle 16 are blown onto the discharge region D1 of the substrate W and therefore foreign matter (particles, etc.) attached to the discharge region D1 can be removed physically by collision of the IPA liquid droplets (physical cleaning). Also, the IPA liquid droplets are blown onto the discharge region D1 in the state where the entirety of the upper surface of the substrate W is covered by the liquid film and thereafter reattachment of the foreign matter to the substrate W is suppressed or prevented.

Also, the IPA liquid film covering the discharge region D1 is formed on the upper surface of the substrate W prior to the discharge of the IPA liquid droplets. Therefore, at the start of discharge of the IPA liquid droplets, the IPA liquid droplets discharged from the double-fluid nozzle 16 collide against the IPA liquid film covering the discharge region D1. Direct collision of the IPA liquid droplets against the upper surface of the substrate W in the dry state can thus be avoided at the start of discharge of the IPA liquid droplets.

Also, by switching the supplying of the gas to the double-fluid nozzle 16 from the stopped state to the supplying state while sustaining the supplying of the IPA to the double-fluid nozzle 16, the IPA discharged from the double-fluid nozzle 16 can be switched from the continuous stream mode to the liquid droplet mode. That is, the IPA supplied to the upper surface of the substrate W in the IPA liquid film forming step (S3) is discharged from the double-fluid nozzle 16.

Also, in parallel to the discharge of the jet of IPA liquid droplets from the double-fluid nozzle 16, the controller 7 controls the arm swinging unit 19 to make the double-fluid nozzle 16 move back and forth horizontally between the central position and the peripheral edge position. Specifically, first, the double-fluid nozzle 16 disposed at the peripheral edge position is moved toward the central position. The position of the discharge region D1 is thereby moved along the upper surface of the substrate W toward the central axis A1 while being covered by the IPA liquid film.

When the double-fluid nozzle 16 reaches the central position, the controller 7 controls the arm swinging unit 19 to reverse the swinging direction of the nozzle arm 17. The double-fluid nozzle 16 is thus made to start movement from the central position toward the peripheral edge position. The position of the discharge region D1 is thereby moved along the upper surface of the substrate W toward the peripheral edge portion of the substrate W while being covered by the IPA liquid film. When the double-fluid nozzle 16 reaches the peripheral edge position, the controller 7 controls the arm swinging unit 19 to reverse the swinging direction of the nozzle arm 17. The position of the discharge region D1 is thereby moved along the upper surface of the substrate W toward the central axis A1. The position of the discharge region D1 is thus moved back and forth between the peripheral edge portion of the substrate W and the central portion of the substrate W.

The double-fluid nozzle 16 is moved between the central position and the peripheral edge position while rotating the substrate W, and therefore the upper surface of the substrate W is scanned by the discharge region D1 and the position of the discharge region D1 passes through the entirety of the upper surface of the substrate W. The IPA discharged from the double-fluid nozzle 16 is thus supplied to the entirety of the upper surface of the substrate W and the entirety of the upper surface of the substrate W is processed uniformly. The IPA supplied to the upper surface of the substrate W is scattered from the peripheral edge portion of the substrate W toward the sides of the substrate W.

A moving speed of the double-fluid nozzle 16 (that is, a scanning speed of the discharge region D1) is set, for example, to approximately 30 to 80 mm/second.

As shown in FIG. 6B, the IPA that scatters from the peripheral edge portion of the substrate W is received by the inner wall of the first guard 38. The IPA that flows down along the inner wall of the first guard 38 is received by the first cup 36 and collected at the bottom portion of the first cup 36. The IPA collected at the bottom portion of the first cup 36 is delivered through the first piping (not shown) to the recovery equipment (not shown) or the drain equipment (not shown).

When a predetermined period elapses from the start of supply of gas with respect to the double-fluid nozzle 16, the controller 7 controls the spin motor 12 to accelerate the rotation speed of the substrate W to a second high rotation speed (for example of approximately 1000 rpm) and thereafter maintain the rotation speed at the second high rotation speed. Also, while sustaining the discharge of IPA, the controller 7 controls the arm swinging unit 19 so that the double-fluid nozzle 16 is moved toward the central position and disposed at the central position. The IPA liquid droplet discharging step (S4) is thereby ended. A processing period of the IPA liquid droplet discharging step (S4) is, for example, approximately 8 to 96 seconds.

Figure 6C:
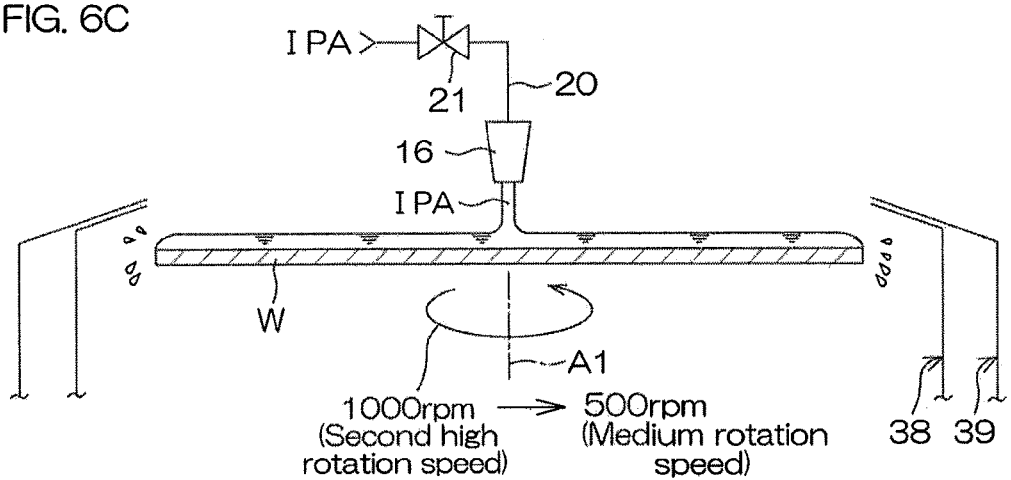
FIGS. 6C and 6D are schematic diagrams for describing processes following that of FIG. 6B.

After the double-fluid nozzle 16 is disposed at the central position, an IPA post-supplying step (post-supplying step; second rotating step; step S5 of FIG. 5) of supplying a continuous stream of IPA to the upper surface of the substrate W is performed as shown in FIG. 6C. Specifically, the controller 7 closes the first gas valve 24 that was open up to this point. The supplying of the gas with respect to the double-fluid nozzle 16 is thereby stopped and the continuous stream of IPA is discharged from the double-fluid nozzle 16 (the discharge flow rate of IPA is 0.1 (liters/minute)). By switching the supplying of the gas to the double-fluid nozzle from the supplying state to the stopped state while sustaining the supplying of the IPA to the double-fluid nozzle 16, the IPA discharged from the double-fluid nozzle can be switched from the liquid droplet mode to the continuous stream mode.

The continuous stream of IPA discharged from the double-fluid nozzle 16 lands on the upper surface of the substrate W rotating at the second high rotation speed and thereafter receives a centrifugal force due to the rotation of the substrate W and flows outward along the upper surface of the substrate W. The IPA is thus supplied to the entirety of the upper surface of the substrate W and an IPA liquid film covering the entirety of the upper surface of the substrate W is formed on the substrate W as shown in FIG. 6C. The IPA that has reached the peripheral edge portion upon flowing on the upper surface of the substrate W is scattered toward the sides of the substrate W from the peripheral edge portion of the substrate W. In the IPA post-supplying step (S5), the foreign matter removed from the substrate W upper surface by the physical cleaning in the IPA liquid droplet discharging step (S4) is rinsed off by the IPA.

Also, the IPA liquid film formed on the upper surface of the substrate W can be leveled prior to a drying step (S7) because the IPA liquid film is formed on the upper surface of the substrate W in the IPA post-supplying step (S5).

As shown in FIG. 6C, the IPA that scatters from the peripheral edge portion of the substrate W is received by the inner wall of the first guard 38. The IPA that flows down along the inner wall of the first guard 38 is received by the first cup 36 and collected at the bottom portion of the first cup 36. The IPA collected at the bottom portion of the first cup 36 is delivered through the first piping (not shown) to the recovery equipment (not shown) or the drain equipment (not shown).

When a predetermined period elapses from the start of discharge of the IPA, the controller 7 controls the spin motor 12 to decelerate the rotation speed of the substrate W to a medium rotation speed (for example of approximately 500 rpm) and maintain the rotation speed at the medium rotation speed. Thereafter, the controller 7 controls the organic solvent valve 21 to stop the discharge of IPA from the double-fluid nozzle 16 and controls the arm swinging unit 19 so that the double-fluid nozzle 16 is retracted from the central position (processing position) to the home position. The IPA post-supplying step (S5) is ended by stoppage of discharge of IPA from the double-fluid nozzle 16. A processing period of the IPA post-supplying step (S5) is, for example, approximately 5 to 6 seconds.

Also, the rotation speed of the substrate W is decelerated to the medium rotation speed prior to the end of the IPA post-supplying step (S5) because if the rotation of the substrate W at the second high rotation speed is continued as it is, the IPA supplied to the upper surface of the substrate W may volatilize, causing the upper surface of the substrate W to dry and thereby cause particle formation.

After the discharge of IPA from the double-fluid nozzle 16 is stopped, the controller 7 controls the spin motor 12 to decelerate the rotation speed of the substrate W, rotating at the medium rotation speed, to a low rotation speed (for example of approximately 10 rpm) and maintain the rotation speed at the low rotation speed. The low rotation speed may be zero (that is, stoppage of rotation).

Figure 6D:
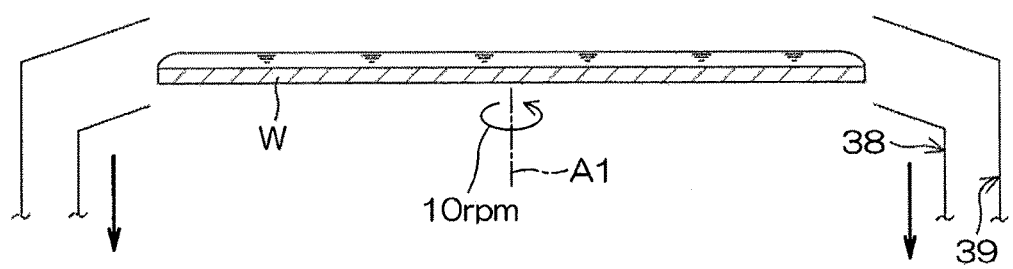

After the substrate W reaches the low rotation speed, the controller 7 controls the guard raising/lowering unit 40, while maintaining the rotation speed of the substrate W at the low rotation speed, to lower the first guard 38 from the upper position to the lower position while maintaining the second guard 39 at the upper position and thereby make the second guard 39 face the peripheral end surface of the substrate W as shown in FIG. 6D. That is, the guard facing the peripheral end surface of the substrate W is switched (changed (step S6 of FIG. 5: facing guard changing step)) from the first guard 38 to the second guard 39.

Figure 6E:
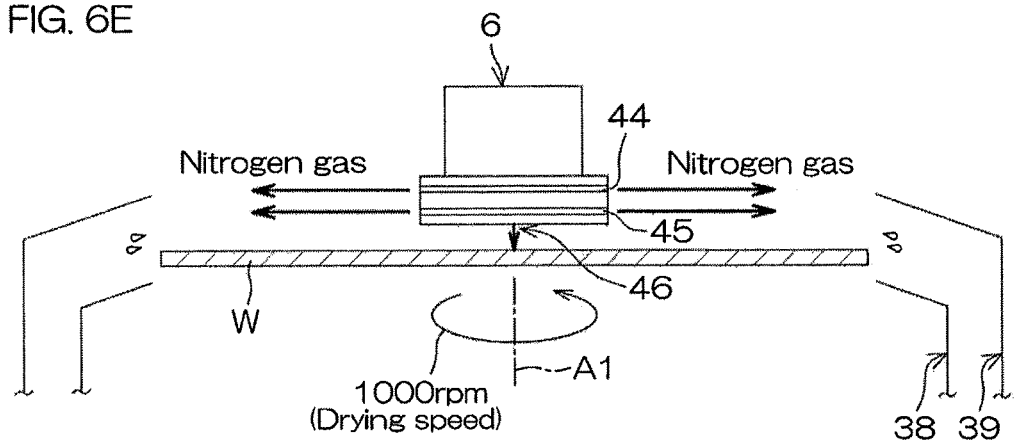
FIG. 6E is a schematic diagram for describing a process following that of FIG. 6D.

After the second guard 39 is disposed to face the peripheral end surface of the substrate W, the controller 7 executes the drying step (step S7 of FIG. 5) as shown in FIG. 6E.

Specifically, the controller 7 controls the spin motor 12 to increase the rotation speed of the substrate W from the low rotation speed. Also, the controller 7 controls the gas nozzle moving unit 52 to move the gas discharge nozzle 6 from the upper position to the proximity position. After the gas discharge nozzle 6 is disposed at the proximity position, the controller 7 opens the second gas valve 50 and the third gas valve 51 to make nitrogen gas, which is an example of the gas, be discharged from the three gas discharge ports (the upper gas discharge port 44, the lower gas discharge port 45, and the central gas discharge port 46). Three annular gas streams overlapping in the up/down direction are thereby formed above the substrate W and the upper surface of the substrate W is protected by the three annular gas streams.

After starting the discharge of nitrogen gas from the three gas discharge ports 44, 45, and 46 of the gas discharge nozzle 6, the controller 7 controls the spin motor 12 to make the substrate W rotate at a predetermined drying speed (for example of approximately 1000 rpm). The IPA on the substrate W is thereby spun off outward and the substrate W dries. Also, the drying of the substrate W is performed in a state where the upper surface of the substrate W is covered by the three annular gas streams, and therefore particles and other foreign matter and IPA mist that are suspended inside the processing chamber 2 are suppressed or prevented from attaching to the substrate W during the drying step (S7).

The IPA liquid droplets that scatter from the peripheral edge portion of the substrate W in the drying step (S7) are received by an inner wall of the second guard 39 as shown in FIG. 6E. The IPA that flows down along the inner wall of the second guard 39 is received by the second cup 37 and collected at a bottom portion of the second cup 37. The IPA collected at the bottom portion of the second cup 37 is delivered through the second piping (not shown) to the recovery equipment (not shown) or the drain equipment (not shown).

When the drying step (S7) has been performed for a predetermined period (for example of 12 seconds), the controller 7 drives the spin motor 12 to stop the rotation of the spin chuck 3 (rotation of the substrate W) (step S8 of FIG. 5). After stopping the rotation of the substrate W by the spin chuck 3, the controller 7 closes the second gas valve 50 and the third gas valve 51 to stop the discharge of gas from the three gas discharge ports 44, 45, and 46. After stopping the discharge of gas from the three gas discharge ports 44, 45, and 46, the controller 7 controls the gas nozzle moving unit 52 to make the gas discharge nozzle 6 retract to the periphery of the spin chuck 3.

The cleaning processing of the single substrate W is thereby ended and, as when the substrate W was carried in, the controller 7 carries the processed substrate W out from inside the processing chamber 2 by means of the transfer robot (step S9 of FIG. 5).

First and second cleaning tests shall now be described.

In each of the first and second cleaning tests, a substrate processing method (cleaning processing) according to an example described below is applied to a sample.

Example

A bare silicon substrate W (outer diameter: 300 (mm)) was adopted as the sample and IPA was adopted as the organic solvent. The substrate processing apparatus 1 was used to execute the processing example of the cleaning processing shown in FIG. 5 to FIG. 6E described above on the sample held by the spin chuck 3 (see FIG. 1) and put in a rotating state.

Also, in the first cleaning test, a substrate processing method (cleaning processing) according to a comparative example described below is applied to a sample.

Comparative Example

A bare silicon substrate W (outer diameter: 300 (mm)) was adopted as the sample and IPA was adopted as the organic solvent. The substrate processing apparatus 1 was used to execute a cleaning processing on the sample held by the spin chuck 3 (see FIG. 1) and put in a rotating state. The cleaning processing according to the comparative example differs from the processing example of the cleaning processing shown in FIG. 5, FIG. 6B, FIG. 6D, and FIG. 6E described above in the point that both the IPA liquid film forming step (S3 of FIG. 5) and the IPA post-supplying step (S5 of FIG. 5) are abolished and is the same as the processing example of the cleaning processing described above in regard to other points.

<First Cleaning Test>

For the example, a distribution and number of particles on the front surface of the substrate W after the cleaning processing were measured. The cleaning test was performed twice and test results of the first cleaning test performed with the example are shown respectively in FIGS. 7A and 7B.

Figure 7A:
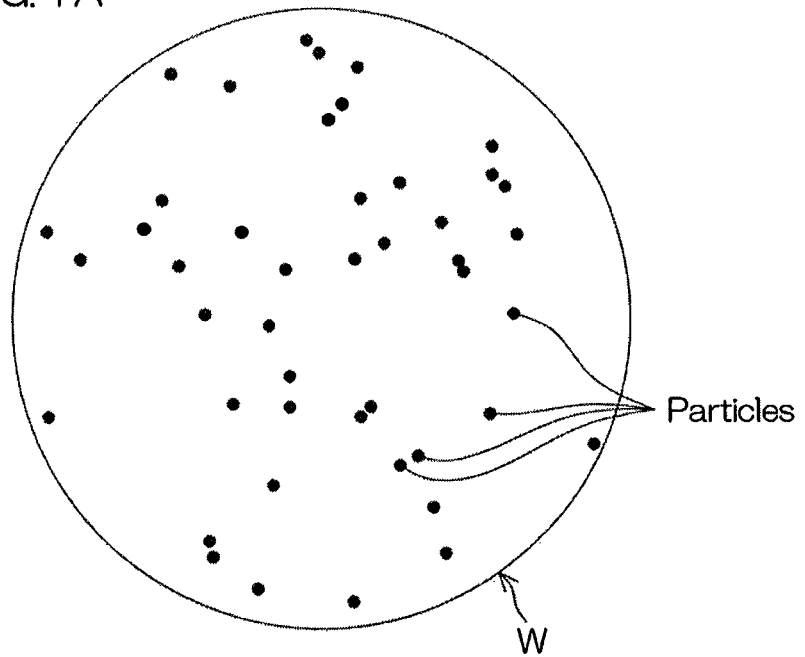
FIGS. 7A and 7B are diagrams of test results of a first cleaning test performed with an example.

On the front surface of the substrate W after the cleaning test shown in FIG. 7A, 47 particles of not less than 26 nm were present. The number of particles on the front surface of the substrate W before performing the test was 46 and although this means that the number of particles increased by one, this is within the range of measurement error. It is therefore believed that there is no practical increase or decrease in the number of particles on the substrate W front surface before and after the cleaning test.

Figure 7B:
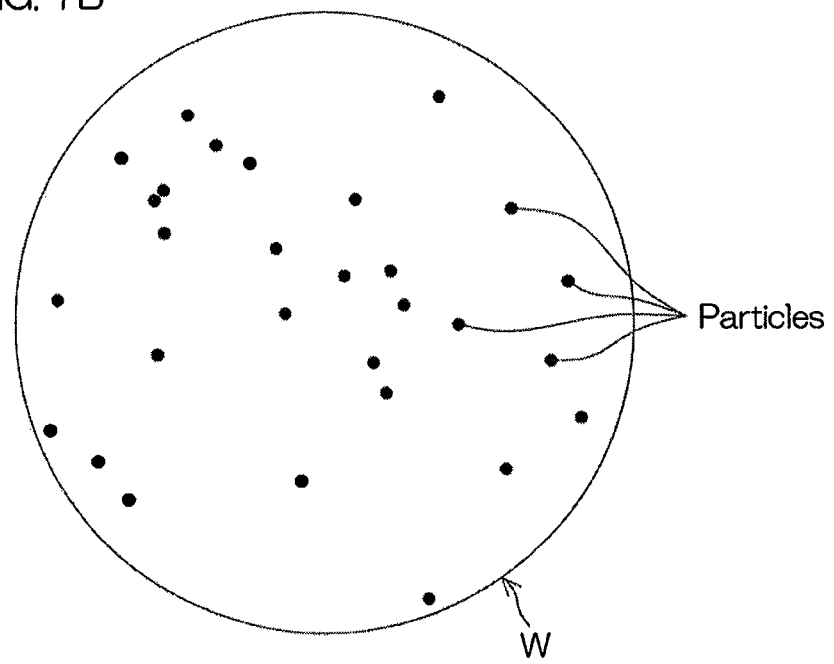

Also, on the front surface of the substrate W after the cleaning test shown in FIG. 7B, 32 particles of not less than 26 nm were present. The number of particles on the front surface of the substrate W before performing the cleaning test was 25 and although this means that the number of particles increased by seven, this is within the range of measurement error. It is therefore believed that there is no practical increase or decrease in the number of particles on the substrate W front surface before and after the cleaning test.

It can thus be understood that when both the IPA liquid film forming step (S3 of FIG. 5) and the IPA post-supplying step (S5 of FIG. 5) are performed, particles formed in the IPA liquid droplet discharging step (S4 of FIG. 5) can be suppressed effectively from remaining on the substrate W.

Figure 8:
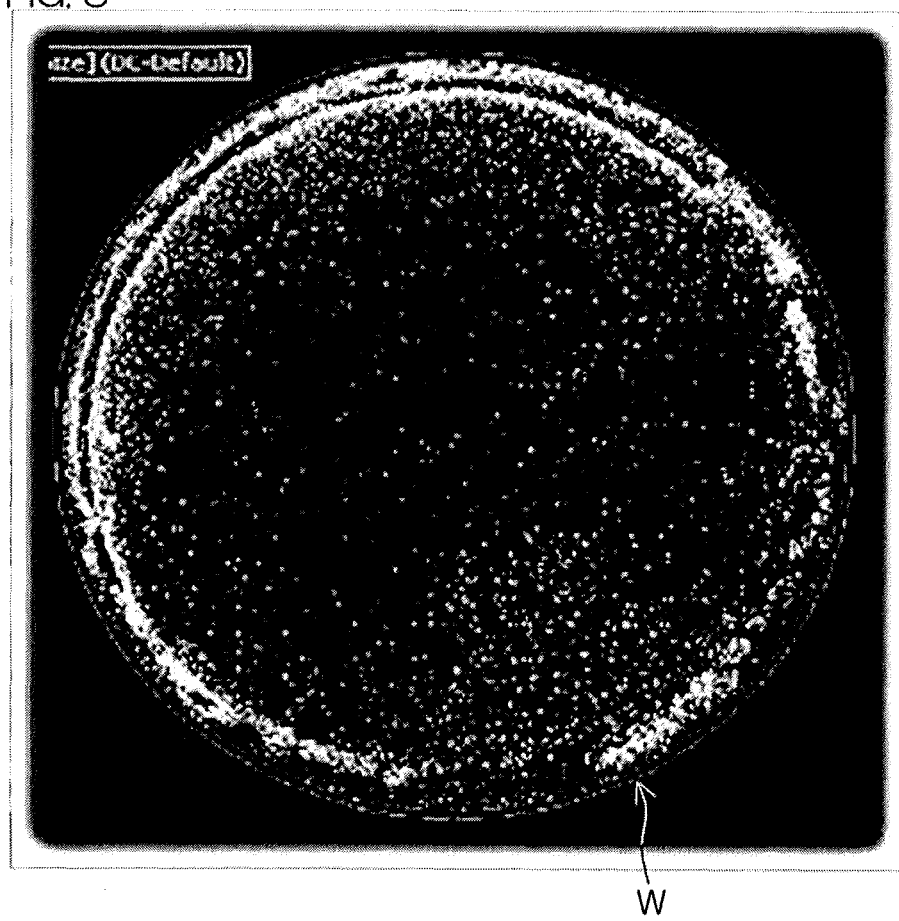
FIG. 8 is a diagram of a test result of the first cleaning test performed with a comparative example.

Meanwhile, for the comparative example, the distribution and number of particles on the front surface of the substrate W after the cleaning processing were measured. A test result of the first cleaning test performed with a comparative example is shown in FIG. 8. A measurement result of the particle distribution is shown in FIG. 8. White portions appearing in FIG. 8 are particles. On the front surface of the substrate W after the cleaning test, not less than approximately 45000 particles were present. It can thus be understood that when both the IPA liquid film forming step (S3 of FIG. 5) and the IPA post-supplying step (S5 of FIG. 5) are not performed, many of the particles formed in the IPA liquid droplet discharging step (S4 of FIG. 5) remain on the front surface of the substrate W.

A description regarding the distribution of particles shall now be provided. In each of the examples of FIG. 7A and FIG. 7B, biasing of the particles on the substrate W after the cleaning test was not seen in particular. On the other hand, with the comparative example of FIG. 8, a pattern where especially many particles form in a double annular form at the peripheral edge portion of the substrate W was seen. A reason for formation of the particle pattern at the peripheral edge portion of the substrate W is considered to be that the IPA liquid film forming step (S3 of FIG. 5) was not performed before the IPA liquid droplet discharging step (S4 of FIG. 5). That is, in the IPA liquid droplet discharging step (S4 of FIG. 5), the double-fluid nozzle 16 starts scanning the substrate W from the peripheral edge portion of the substrate W. The IPA liquid droplets from the double-fluid nozzle 16 immediately after the start of discharge vary greatly in particle diameter. It is known that particle characteristics of the substrate W after cleaning degrade when the jet of IPA liquid droplets, which vary greatly in particle diameter, is made to collide against the substrate W front surface. In each of the examples of FIG. 7A and FIG. 7B, the IPA liquid film forming step (S3 of FIG. 5) is performed before the IPA liquid droplet discharging step (S4 of FIG. 5) and therefore the jet of IPA liquid droplets collide not directly against the front surface of the substrate W but collide via the IPA liquid film. The particle characteristics at the peripheral edge portion of the substrate W (that is, at the location at which the jet of IPA liquid droplets is oriented immediately after the start of discharge) are thus satisfactory. On the other hand, with the comparative example of FIG. 8, the IPA liquid film forming step (S3 of FIG. 5) is not performed and the jet of IPA liquid droplets, which vary greatly in particle diameter, collide against the front surface of the substrate W without intervention of an IPA liquid film. The particle characteristics are thus degraded at the peripheral edge portion of the substrate W.

Further, a reason as to why the mode of particles exhibit a double annular form at the peripheral edge portion of the substrate W in FIG. 8 is considered to be as follows. That is, in the circular discharge region D1 (see FIG. 6B) on the upper surface of the substrate W, whereas a large amount of liquid droplets are supplied to a central portion of the discharge region D1, only a minute amount of liquid droplets are supplied to an outer peripheral portion of the discharge region D1. Therefore variation of particle diameter of the IPA liquid droplets tends to be significant and particles form readily at the outer peripheral portion of the discharge region D1. This is considered to be a factor for the double annular form of particles.

<Second Cleaning Test>

As the rotation speed of the substrate W increases, the IPA liquid film in the IPA liquid droplet discharging step (S4 of FIG. 5) becomes thinner and the liquid droplets of the IPA jet begin to act directly on the upper surface of the substrate W. Also as the rotation speed of the substrate W increases, gaps do no form in a locus of the discharge region D1 (see FIG. 6B) and the entirety of the substrate W begins to be scanned by the discharge region D1. Removal performance of the cleaning processing is thus improved as the rotation speed of the substrate W increases.

Figures 9, 10:
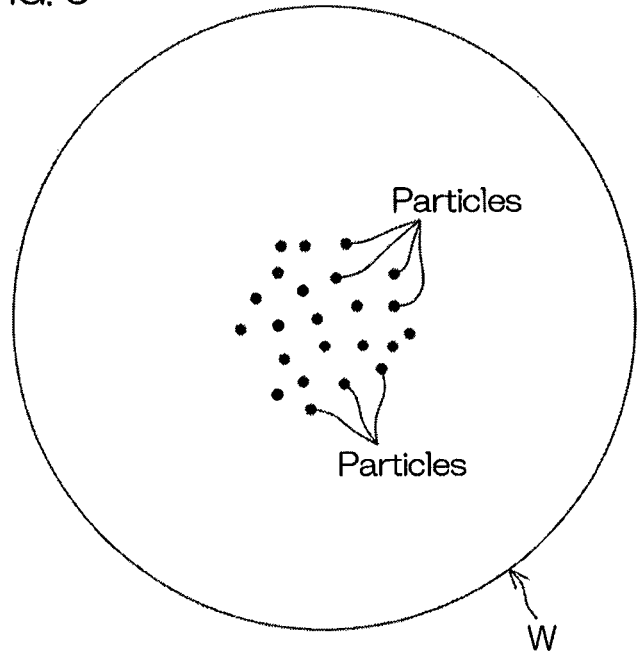
FIG. 9 is a schematic plan view for describing a particle mode.
FIG. 10 is a diagram of test results of a second cleaning test.

On the other hand, as the rotation speed of the substrate W becomes high, particles begin to form slightly at a central portion of the upper surface of the substrate W (this state shall hereinafter referred to as the "particle mode"). FIG. 9 is a schematic plan view for describing the particle mode. When the rotation speed of the substrate W is high, a centrifugal force acts on the IPA supplied to the substrate W and the IPA moves toward the peripheral edge portion of the substrate W. In particular, the central portion of the upper surface of the substrate W dries in some cases in a state where the discharge region D1 (see FIG. 6B) is disposed at the peripheral edge portion of the substrate W. It may be considered that particles are formed slightly (the particle mode became manifest) due to the drying of the central portion of the substrate W.

In the second cleaning test, the rotation speed of the substrate W in the IPA liquid droplet discharging step (S4 of FIG. 5) of the example was varied at 300 rpm, 400 rpm, 500 rpm, and 1000 rpm. A degree of cleanness of the front surface of the substrate W (removal performance (cleaning performance) of the cleaning processing) after the cleaning processing and whether or not the particle mode occurred on the substrate W after the cleaning processing were respectively observed visually. Also, the number of particles of size not less than 26 (nm) on the front surface of the substrate W after the cleaning processing was also measured.

The test results of the second cleaning test are shown in FIG. 10. FIG. 10 shows, for the example, relationships of the rotation speed of the substrate W with respect to the occurrence of the particle mode after the cleaning processing and the removal performance of the cleaning processing. In regard to whether or not the particle mode occurred, "Good" is indicated in a case where the particle mode does not occur and "Insufficient" is indicated in a case where the particle mode occurs. Also, in regard to the degree of cleanness of the substrate W (removal performance (cleaning performance) of the cleaning processing), "Good" is indicated in a case where the degree of cleanness is satisfactory and "Insufficient" is indicated in a case where the degree of cleanness is poor. Also, the number of particles that formed at the central portion of the front surface of the substrate W after the cleaning processing is indicated in parenthesis.

It can be understood from FIG. 10 that the removal performance of the cleaning processing is low when the rotation speed of the substrate W in the IPA liquid droplet discharging step (S4 of FIG. 5) is not more than 300 rpm. As one cause, it is considered that the liquid film on the substrate W becomes too thick and consequently a sufficient amount of IPA liquid droplets do not reach the upper surface of the substrate W in the IPA liquid droplet discharging step (S4 of FIG. 5). Also, as another cause, it is considered that the rotation speed of the substrate W is too slow with respect to the moving speed of the discharge region D1, causing gaps to form in the locus of the discharge region D1 (see FIG. 6B) so that, consequently, the entirety of the substrate W cannot be scanned by the discharge region D1.

It can be understood from FIG. 10 that the particle mode occurs when the rotation speed of the substrate W in the IPA liquid droplet discharging step (S4) is not less than 500 rpm.

It can be understood from the above that the removal performance of the cleaning processing is high and the occurrence of the particle mode can be suppressed when the rotation speed of the substrate W exceeds 300 rpm and is less than 500 rpm (and especially when the rotation speed is approximately 400 rpm).

As described above, with the first preferred embodiment, IPA liquid droplets are discharged from the double-fluid nozzle 16 toward the discharge region D1 within the upper surface of the substrate W. Foreign matter (particles, etc.) attached to the discharge region D1 are removed physically by collision of the IPA liquid droplets against the upper surface of the substrate W. The upper surface of the substrate W can thereby be cleaned satisfactorily.

Also, the IPA liquid film that covers the discharge region D1 within the upper surface of the substrate W is formed before the discharge of the IPA liquid droplets. Therefore, the IPA liquid droplets discharged from the double-fluid nozzle 16 collide against the IPA liquid film covering the discharge region D1. The IPA liquid droplets can thus be prevented from directly colliding against the upper surface of the substrate W in the dry state at the start of IPA liquid droplet discharge at which the particle diameter distribution of the IPA liquid droplets discharged from the double-fluid nozzle 16 is unstable. Formation of particles in accompaniment with the execution of the IPA liquid droplet discharging step (S4) can thus be suppressed.

By the above, the upper surface of the substrate W can be processed satisfactorily using the IPA liquid droplets from a double-fluid nozzle 16 while suppressing the formation of particles.

Also, damage of the substrate W in accompaniment with the supplying of liquid droplets of the IPA jet can be suppressed to the minimum because the discharge region D1 within the upper surface of the substrate W is protected by the IPA liquid film.

As described above, by setting the rotation speed of the substrate W to 400 rpm and setting the discharge flow rate of IPA from the double-fluid nozzle 16 at a low value of 0.1 liters/minute, the thickness of the IPA liquid film on the upper surface of the substrate W can be kept thin. The particle performance of the cleaning processing using IPA can thereby be improved. Moreover, under these conditions, the formation of particles (the occurrence of the particle mode) in accompaniment with the IPA liquid droplet discharging step (S4) can be suppressed effectively.

Also, in the IPA liquid film forming step (S3), the IPA supplied to the upper surface of the substrate W is discharged from the double-fluid nozzle 16.

If, for instance, a liquid film forming nozzle (not shown) is provided separately from the double-fluid nozzle 16 and the IPA to be supplied to the upper surface of the substrate W is made to be discharged from the liquid film forming nozzle in the IPA liquid film forming step (S3), a waiting time until the start of IPA discharge from the double-fluid nozzle 16 (start of the IPA liquid droplet discharging step (S4)) arises after the end of execution of the IPA liquid film forming step (S3). due to movement of the double-fluid nozzle 16 and the liquid film forming nozzle, etc., and the upper surface of the substrate W may dry during the waiting time.

On the other hand, with the first preferred embodiment, the IPA to be supplied to the upper surface of the substrate W is discharged from the double-fluid nozzle 16 in the IPA liquid film forming step (S3). Therefore, during the transition from the IPA liquid film forming step (S3) to the IPA liquid droplet discharging step (S4), the IPA can be supplied without interruption to the upper surface of the substrate W. Drying of the upper surface of the substrate W during the transition from the IPA liquid film forming step (S3) to the IPA liquid droplet discharging step (S4) can thus be suppressed. The formation of particles can thus be suppressed effectively during the transition from the IPA liquid film forming step (S3) to the liquid droplet discharging step (S4).

Also, in the IPA post-supplying step (S5) performed after the IPA liquid droplet discharging step (S4), a continuous stream of the IPA is supplied to the upper surface of the substrate W. The foreign matter removed from the substrate W upper surface by the physical cleaning in the IPA liquid droplet discharging step (S4) can thus be rinsed off by the IPA and reattachment of the foreign matter onto the upper surface of the substrate W can thereby be suppressed or prevented.

Also, the rotation speed of the substrate W in the IPA post-supplying step (S5) is a higher speed (the second high rotation speed) than that in the IPA liquid droplet discharging step (S4) and therefore a large centrifugal force acts on the IPA supplied to the upper surface of the substrate W. The foreign matter removed from the upper surface of the substrate W by the physical cleaning can thereby be spun off from sides of the substrate W together with the IPA and remaining of the foreign matter on the upper surface of the substrate W can thus be suppressed or prevented.

Also, in the IPA post-supplying step (S5), the IPA supplied to the upper surface of the substrate W is discharged from the double-fluid nozzle 16.

If, for instance, a post-supplying nozzle (not shown) is provided separately from the double-fluid nozzle 16 and the IPA to be supplied to the upper surface of the substrate W is made to be discharged from the post-supplying nozzle in the IPA post-supplying step (S5), a waiting time until the start of IPA discharge from the post-supplying nozzle (start of the IPA post-supplying step (S5)) arises after the end of execution of the IPA liquid droplet discharging step (S4) due to movement of the double-fluid nozzle 16 and the post-supplying nozzle, etc., and the upper surface of the substrate W may dry during the waiting time.

On the other hand, with the first preferred embodiment, the IPA to be supplied to the upper surface of the substrate W is discharged from the double-fluid nozzle 16 in the IPA post-supplying step (S5). Therefore, during the transition from the IPA liquid droplet discharging step (S4) to the IPA post-supplying step (S5), the IPA can be supplied without interruption to the upper surface of the substrate W, and drying of the upper surface of the substrate W during the transition from the IPA liquid droplet discharging step (S4) to the IPA post-supplying step (S5) can thus be suppressed effectively. Formation of particles during the transition from the IPA liquid droplet discharging step (S4) to the IPA post-supplying step (S5) can thus be suppressed effectively.

Also, in the IPA liquid droplet discharging step (S4), in which the upper surface of the substrate W is physically cleaned by the IPA liquid droplets, the IPA expelled from the substrate W contains the foreign matter removed from the substrate W. During the IPA liquid drop discharging step (S4), the first guard 38 faces the peripheral end surface of the substrate W and the IPA that contains the foreign matter becomes attached to the first guard 38.

In the drying step (S7) according to the first preferred embodiment, the second guard 39 is made to face the peripheral end surface of the substrate W instead of the first guard 38 that has the foreign-matter-containing IPA attached thereto. Therefore during the drying step (S7), the substrate W after the cleaning processing can be suppressed effectively from being contaminated by the IPA attached to the guard facing the peripheral end surface of the substrate W. The substrate W can thereby be processed satisfactorily using the IPA liquid droplets from the double-fluid nozzle 16 while suppressing the formation of particles even more effectively.

Figure 11:
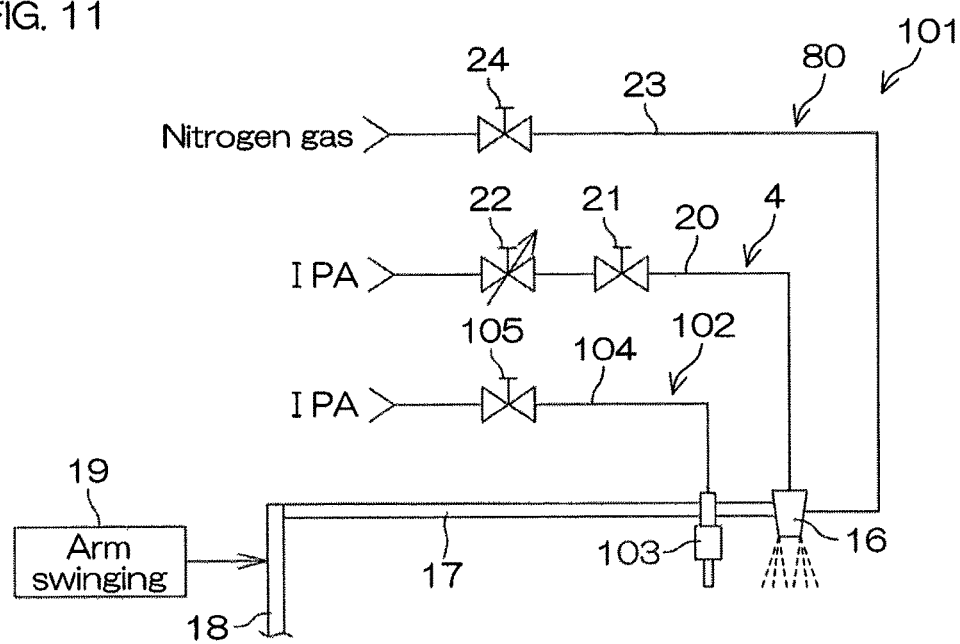
FIG. 11 is an illustrative diagram of a portion of a substrate processing apparatus which executes a substrate processing method according to a second preferred embodiment of the present invention.

FIG. 11 is an illustrative diagram of a portion of a substrate processing apparatus 101 which executes a substrate processing method according to a second preferred embodiment of the present invention. FIGS. 12A and 12B are illustrative diagrams for describing the IPA liquid droplet discharging step (S4) in a cleaning processing according to the second preferred embodiment of the present invention.

In FIG. 11 and FIGS. 12A and 12B, portions corresponding to respective portions indicated in the first preferred embodiment shall be indicated by attaching the same reference symbols as in the case of FIG. 1 to FIG. 10 and description thereof shall be omitted.

The substrate processing apparatus 101 according to the second preferred embodiment differs from the substrate processing apparatus 1 according to the first preferred embodiment in the point of being provided with an additional organic solvent supplying unit (fourth organic solvent supplying unit) 102 in addition to the organic solvent supplying unit 4.

The additional organic solvent supplying unit 102 includes an organic solvent nozzle 103 constituted of a straight nozzle. The organic solvent nozzle 103 is a nozzle that discharges IPA in a continuous stream mode and is mounted on the nozzle arm 17. Therefore, when the nozzle arm 17 is swung to move the position of the discharge region D1 (see FIGS. 12A and 12B), the double-fluid nozzle 16 and the organic solvent nozzle 103 move while keeping fixed a positional relationship of the double-fluid nozzle 16 and the organic solvent nozzle 103. The organic solvent nozzle 103 is mounted on the nozzle arm 17 so that an IPA supply region Su1 in the upper surface of the substrate W is positioned at an outer side in a radial direction with respect to the discharge region D1.

The additional organic solvent supplying unit 102 includes an additional organic solvent piping 104 guiding IPA from an IPA supply source to the organic solvent nozzle 103 and an additional organic solvent valve 105 opening and closing the additional organic solvent piping 104. When the additional organic solvent valve 105 is opened, liquid IPA at ordinary temperature from the IPA supply source is supplied to the organic solvent nozzle 103 through the additional organic solvent piping 104. A continuous stream of the IPA is thereby discharged from the organic solvent nozzle 103.

As shown indicated by the two-dot-and-dash line in FIG. 2B, in addition to the description of the controller 7 in the first embodiment, the controller 7 further is connected to the operations of the additional organic solvent valve 105, and the like. The controller 7 controls the opening and closing operation etc. on the additional organic solvent valve 105, etc., in accordance with a predetermined program.

In the cleaning processing according to the second preferred embodiment, a cleaning processing equivalent to the cleaning processing according to the first preferred embodiment (the cleaning processing shown in FIG. 5) is executed. In the IPA liquid droplet discharging step (S4), discharge of the continuous stream of IPA from the organic solvent nozzle 103 is performed in parallel to the discharge of IPA liquid droplets from the double-fluid nozzle 16. The step differs from the IPA liquid droplet discharging step (S4) according to the first preferred embodiment in this point. The point of difference shall now be described.

In the IPA liquid droplet discharging step (S4), the controller 7 controls the arm swinging unit 19 to make the double-fluid nozzle 16, which is discharging the jet of IPA liquid droplets, move back and forth horizontally between the central position and the peripheral edge position, and the position of the discharge region D1 is thereby moved between the central portion of the substrate W and the peripheral edge portion of the substrate W (discharge region moving step). The organic solvent nozzle 103 is also moved back and forth horizontally accordingly.

When as shown in FIG. 12A, the double-fluid nozzle 16 is being moved from the peripheral edge position toward the central position, the controller 7 opens the additional organic solvent valve 105 to make a continuous stream of IPA be discharged from the organic solvent nozzle 103 (additional organic solvent supplying step). The continuous stream of IPA is thereby supplied to a rearward position with respect to a direction of progress of the discharge region D1 in the upper surface of the substrate W. On the other hand, when as shown in FIG. 12B, the double-fluid nozzle 16 is being moved from the central position toward the peripheral edge position, the controller 7 closes the additional organic solvent valve 105 so that the IPA is not discharged from the organic solvent nozzle 103.

In other words, the continuous stream of IPA is discharged from the organic solvent nozzle 103 when the supply region Su1 is positioned rearward with respect to the direction of progress of the discharge region D1, and the IPA is not discharged from the organic solvent nozzle 103 when the IPA supply region Su1 is positioned forward with respect to the direction of progress of the discharge region D1.

With the second preferred embodiment, regardless of where in the upper surface of the substrate W the position of the discharge region D1 is disposed, the IPA is supplied separately to a vicinity of the position of the discharge region D1. If the upper surface of the substrate W dries during the IPA liquid droplet discharging step (S4), particles may form in the dried region. However, the IPA is supplied to the vicinity of the position of the discharge region D1 and therefore drying of the upper surface of the substrate W during the IPA liquid droplet discharging step (S4) can be prevented.

If, for instance, the IPA supply region Su1 is disposed at a forward position with respect to the direction of progress of the discharge region D1, the IPA liquid film at the discharge region D1 becomes thick. If the liquid film that covers the discharge region D1 is thick, the IPA may splash in accompaniment with the discharge of the IPA liquid droplets onto the discharge region. Contaminants contained in the IPA may scatter to the periphery due to the splashing of the IPA and may cause particle formation.

With the second preferred embodiment, the IPA is supplied only to the rearward position with respect to the direction of progress of the discharge region D1 and therefore the IPA liquid film at the discharge region D1 can be kept thin while preventing the drying of the upper surface of the substrate W. Splashing of the IPA discharged onto the discharge region D1 can thus be suppressed. Formation of particles in accompaniment with the execution of the IPA liquid droplet discharging step (S4) can thereby be suppressed more effectively.

Although two preferred embodiments of the present invention have been described above, the present invention may be implemented in yet other modes.

For example, in the second preferred embodiment, the organic solvent nozzle 103 may be mounted on the nozzle arm 17 so that the IPA supply region Su1 in the upper surface of the substrate W is positioned at an inner side in the radial direction with respect to the discharge region D1. In this case, the continuous stream of IPA is discharged from the organic solvent nozzle 103 when the double-fluid nozzle 16 is moved from the central position toward the peripheral edge position. On the other hand, the IPA is not discharged from the organic solvent nozzle 103 when the double-fluid nozzle 16 is moved from the peripheral edge position toward the central position. In other words, the continuous stream of IPA is discharged from the organic solvent nozzle 103 when the supply region Su1 is positioned rearward with respect to the direction of progress of the discharge region D1, and the IPA is not discharged from the organic solvent nozzle 103 when the IPA supply region Su1 is positioned forward with respect to the direction of progress of the discharge region D1. In this case, actions and effects equivalent to those of the second preferred embodiment are exhibited.

Also, with each of the first and second preferred embodiments, the substrate W having the $SiO_2$ 63 disposed at the front surface of the silicon substrate 61 (see FIG. 3) was subject to processing. In place of the substrate W, a substrate W1, described below, may be subject to the processing by the substrate processing apparatus 1 or 101.

Figure 13:
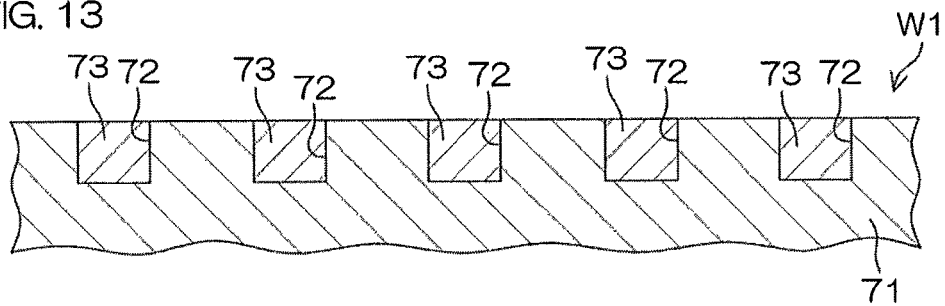
FIG. 13 is an enlarged sectional view of a vicinity of a front surface of another substrate to be processed.

FIG. 13 is an enlarged sectional view of a vicinity of a front surface of the substrate W1 to be processed by the substrate processing apparatus 1 or 101.

The substrate W1 to be processed constitutes a base of a semiconductor device having a multilayer wiring structure of copper wirings and has an insulating film 71, constituted of a low-k (a low dielectric constant material of lower relative dielectric constant than $SiO_2$, more preferably an ULK (ultra low-k)) film formed at a surface layer portion. The insulating film 71 functions as an insulating layer. Wiring trenches 72 are formed in the insulating film 71 by digging from its front surface. A plurality of the wiring trenches 72 are formed at fixed intervals in a right/left direction in FIG. 13 with each extending in a direction orthogonal to a paper surface of FIG. 13. A copper wiring 73 is embedded in each wiring trench 72. A front surface of the copper wiring 73 is made substantially flush with the front surface of the insulating film 71.

Figure 14A:
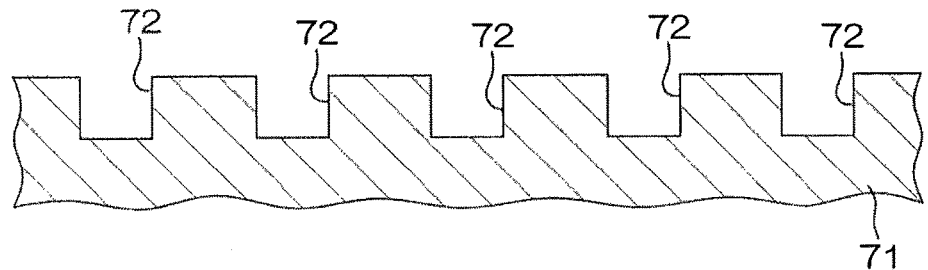
FIGS. 14A to 14C are illustrative sectional views showing a method for manufacturing the substrate shown in FIG. 13 in order of process.
Figure 14B:
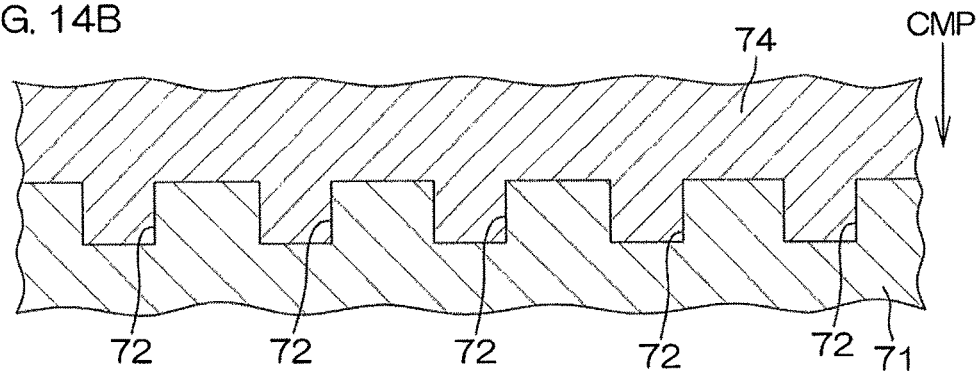
Figure 14C:
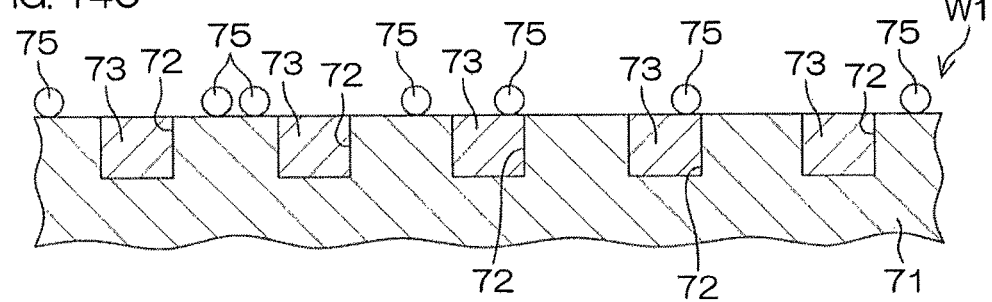

FIGS. 14A to 14C are illustrative sectional views showing a method for manufacturing the substrate W1 in order of process.

First, the insulating film 71 is formed on a semiconductor substrate by a CVD method. Thereafter, the wiring trenches 72 are formed by reactive ion etching in the surface layer portion of the insulating film 71 as shown in FIG. 14A. Thereafter, a copper film 74 is formed on an upper surface of the insulating film 71 and inside each wiring trench 72 as shown in FIG. 14B. As shown in FIG. 14B, the copper film 74 fills the interiors of the wiring trenches 72 completely and is also formed on the insulating film 71 outside the wiring trenches 72.

Next, portions of the copper film 74 protruding outside the respective wiring trenches are removed selectively by a CMP method. A front surface of the copper film 74 is thereby made a flat surface that is substantially flush with the front surface of the insulating film 71 and the copper wirings 73 are formed as shown in FIG. 14C (second preliminary preparation step).

The copper wirings 73 are formed by polishing the copper film 74 by the CMP method and therefore copper polishing scraps (slurry) 75 are present on the surface layer portion of the substrate W1 immediately after manufacture. The substrate processing apparatus 1 applies the cleaning processing to the substrate W1 to remove the copper polishing scraps 75 from the substrate W1.

Generally in such a cleaning processing, a chemical liquid, such as hydrofluoric acid (HF), SC2 (hydrochloric acid/hydrogen peroxide mixture), SPM (sulfuric acid/hydrogen peroxide mixture), etc., is supplied to a substrate held by a spin chuck and thereafter, water, such as pure water (de-ionized water), etc., is supplied to rinse off the chemical liquid on the substrate with the pure water (rinsing processing).

However, if pure water is supplied to the front surface of the substrate W1 during the rinsing processing, the front surfaces of the copper wirings 73 may become oxidized and this may influence the performance of the semiconductor device after manufacture. Thus with the substrate processing apparatus 1, IPA (organic solvent) is used as a cleaning liquid to clean the front surface (upper surface) of the substrate W1. IPA (organic solvent) is low in oxidizing power with respect to copper. The front surface (upper surface) of the substrate W1 can thus be cleaned satisfactorily without excessively etching the front surfaces of the copper wirings 73.

Also, the front surface of the insulating film 71 exhibits high hydrophobicity (lyophobicity) because a low-k material has a high contact angle. However, the front surface of the insulating film 71 having high hydrophobicity can be wetted satisfactorily by using IPA or other organic solvent, having a low surface tension, as the cleaning liquid. An IPA liquid film that covers an entirety of the upper surface of the substrate W1 can thereby be formed satisfactorily.

In this case, if the front surface of the substrate W1 exhibits hydrophobicity, the IPA tends to dry non-uniformly on the upper surface (front surface) of the substrate W1 in the drying step (S7). There is thus a problem that particles tend to form on the upper surface of the substrate W1 during the drying step (S7). However, in the present preferred embodiment, the drying of the substrate W1 is performed in a state where the upper surface of the substrate W1 is covered by the annular gas streams from the gas discharge nozzle 6 and therefore the formation of particles on the upper surface of the substrate W1 can be suppressed.

Also in each of the first and second preferred embodiments, a liquid film forming nozzle (not shown), constituted of a straight nozzle capable of discharging a continuous stream, may be provided separately from the double-fluid nozzle 16 and the IPA to be supplied to the upper surface of the substrate W in the IPA liquid film forming step (S3) may be discharged from the liquid film forming nozzle. In this case, a second organic solvent supplying unit includes the liquid film forming nozzle and an IPA supplying apparatus supplying the IPA to the liquid film forming nozzle.

Also in each of the first and second preferred embodiments, a post-supplying nozzle (not shown), constituted of a straight nozzle capable of discharging a continuous stream, may be provided separately from the double-fluid nozzle 16 and the IPA to be supplied to the upper surface of the substrate W in the IPA post-supplying step (S5) may be discharged from the post-supplying nozzle. In this case, a third organic solvent supplying unit includes the post-supplying nozzle and an IPA supplying apparatus supplying the IPA to the post-supplying nozzle.

In this case, the IPA supplying apparatus for the liquid film forming nozzle and the IPA supplying apparatus for the post-supplying nozzle may be an apparatus in common or may be separate, individual apparatuses. Further, a single nozzle may be used in common as the liquid film forming nozzle (not shown) and the post-supplying nozzle (not shown).

Also, although with each of the first and second preferred embodiments, it was described that the rotation speed of the substrate W in the IPA post-supplying step (S5) is a higher speed than the rotation speed of the substrate W in the IPA liquid droplet discharging step (S4), it may instead be approximately the same speed as the rotation speed of the substrate W in the IPA liquid droplet discharging step or may be a lower speed than the rotation speed of the substrate W in that step.

Also, the IPA post-supplying step (S5) may be abolished. That is, the drying step (S7) may be entered immediately after the end of the IPA liquid droplet discharging step (S4). In this case, the foreign matter removed in the IPA liquid droplet discharging step (S4) is preferably eliminated from above the substrate W by supplying a gas after the end of the IPA liquid droplet discharging step (S4).

Also, although in each of the first and second preferred embodiments, the changing of the guard facing the peripheral end surface of the substrate W (S6) is executed after the end of the IPA post-supplying step (S5) and before starting the drying step (S7), it may be performed before the end of the IPA post-supplying step (S5). For example, it may be performed before the start of IPA post-supplying step (S5) after the end of the IPA liquid droplet discharging step.

Also, the second guard 39 may be made to face the peripheral end surface of the substrate W during the drying step (S7) without performing the changing of the guard facing the peripheral end surface of the substrate W (S6).

Also, although it was described that the gas discharge nozzle 6 has the three gas discharge ports 44, 45, and 46, it does not have to have all three gas discharge ports 44, 45, and 46 and suffices to have at least one gas discharge port.

Also, in the first preferred embodiment, just one of either the substrate W or the double-fluid nozzle 16 may be moved to make the IPA liquid droplets collide against the entirety of the upper surface of the substrate W. Specifically, the double-fluid nozzle 16 may be moved in a state where the substrate W is set still so that the discharge region D1 passes across the entirety of the upper surface of the substrate W. Also, the substrate W may be moved in a state where the double-fluid nozzle 16 is set still so that the discharge region D1 passes across the entirety of the upper surface of the substrate W.

Also in each of the first and second preferred embodiments, the movement locus of the discharge region D1 on the upper surface of the substrate W may be a straight line. That is, the locus may be a straight line extending along the upper surface of the substrate W held by the spin chuck 3 and passing through a central portion (preferably a center) of the upper surface of the substrate W when viewed from a perpendicular direction perpendicular to the upper surface of the substrate W.

Also, although with each of the first and second preferred embodiments, it was described that the discharge region D1 is arranged to be moved back and forth (half-scanned) between one peripheral edge portion of the upper surface of the substrate W and the upper surface central portion of the substrate. W, it may instead be arranged to be moved (full-scanned) between one peripheral edge portion of the upper surface of the substrate W and another peripheral edge portion at an opposite side of the one peripheral edge portion across the substrate W upper surface central portion.

Further, the gas discharge nozzle 6 may be abolished.

Also, although with each of the first and second preferred embodiments, the two stage type processing cup 5 was described as an example, the present invention is applicable to a substrate processing apparatus including a processing cup of a multiple stage type or a single cup type.

Also, although with each of the first and second preferred embodiments, the externally-mixing type double-fluid nozzle 16, which forms liquid droplets by mixing a gas and a liquid by making these collide outside the nozzle body (at the outer cylinder 26 (see FIG. 6)), was described as an example of the double-fluid nozzle 16, the present invention is also applicable to an internally-mixing type double-fluid nozzle, which forms liquid droplets by mixing a gas and a liquid inside the nozzle body.

Also, the organic solvent used in the present invention is not restricted to IPA. The organic solvent includes at least one of IPA, methanol, ethanol, HFE (hydrofluoroether), acetone, and trans-1,2-dichloroethylene. Also, the organic solvent is not restricted to a case of being constituted of a single component but may also be a liquid mixed with another component. For example, it may be a mixed liquid of IPA and acetone or a mixed liquid of IPA and methanol.

Also, although with each of the first and second preferred embodiments, the case where the substrate processing apparatus 1 or 101 is an apparatus arranged to process a disk-shaped substrate was described, the substrate processing apparatus 1 or 101 may instead be an apparatus arranged to process a polygonal substrate, such as a substrate for liquid crystal display device, etc.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

The present application corresponds to Japanese Patent Application No. 2014-265537 filed on Dec. 26, 2014 in the Japan Patent Office, and the entire disclosure of this application is incorporated herein by reference.

What is claimed is:

1. A substrate processing method comprising:
a substrate holding step of holding a substrate horizontally;
a liquid droplet discharging step wherein liquid droplets of an organic solvent, the liquid droplets being formed by mixing the organic solvent and a gas, are discharged from a double-fluid nozzle toward a predetermined discharge region within an upper surface of the substrate; and
a liquid film forming step, executed before the liquid droplet discharging step, of preventing droplets of the organic solvent from directly colliding with the upper surface of the dry substrate, by supplying the organic solvent to the double-fluid nozzle without supplying the gas, so as to discharge the organic solvent in a continuous stream mode from the double-fluid nozzle to form a liquid film of the organic solvent covering the discharge region on the upper surface of the substrate.

2. The substrate processing method according to claim 1, further comprising: a first rotating step of rotating the substrate around the rotational axis during the liquid droplet discharging step.

3. The substrate processing method according to claim 2, further comprising: a post-supplying step of supplying the organic solvent to the upper surface of the substrate after the liquid droplet discharging step.

4. The substrate processing method according to claim 3, further comprising: a second rotating step, executed during the post-supplying step, of rotating the substrate around the rotational axis at a higher speed than that in the first rotating step.

5. The substrate processing method according to claim 3, wherein in the post-supplying step, the organic solvent is supplied to the double-fluid nozzle without supplying the gas, so as to discharge the organic solvent in a continuous stream mode from the double-fluid nozzle.

6. The substrate treatment method according to claim 1, further comprising a nozzle moving step of moving the double fluid nozzle;
wherein the liquid droplet discharging step starts discharging of droplets of the organic solvent to a discharge region of the organic solvent on the upper surface of the substrate at the end of the liquid film forming step.

7. The treatment method according to claim 6,
wherein the discharge region includes a peripheral edge on the upper surface of the substrate; and
the liquid droplet discharging step starts discharging of droplets of the organic solvent to the peripheral edge on the upper surface of the substrate.

8. The substrate processing method according to claim 1, wherein the liquid droplet discharging step is a step that is executed in a state where a first guard is made to face a peripheral end surface of the substrate, and
the substrate processing method further comprises:
a drying step of rotating the substrate around a rotational axis, without supplying the organic solvent to the upper surface of the substrate, to dry the upper surface of the substrate; and
a facing guard changing step of changing the guard facing the peripheral end surface of the substrate from the first guard to a second guard, differing from the first guard, after the liquid droplet discharging step is ended and before the drying step is executed.

9. The substrate processing method according to claim 1, further comprising: a discharge region moving step of moving the position of the discharge region within the upper surface of the substrate; and an additional organic solvent supplying step of supplying, in parallel to the discharge region moving step, the organic solvent to a rearward position with respect to a direction of progress of the discharge region; and
wherein the organic solvent is not supplied to a forward position with respect to the direction of progress of the discharge region in the additional organic solvent supplying step.

10. The substrate processing method according to claim 1, further comprising: a preliminary preparation step of preparing a silicon substrate, having $SiO_2$ disposed at the upper surface, as the substrate.

11. The substrate processing method according to claim 1, further comprising: a preliminary preparation step of preparing a semiconductor substrate, including an insulating film constituted of a low dielectric constant material of lower relative dielectric constant than $SiO_2$ and a copper wiring disposed on the insulating film, as the substrate.

* * * * *